United States Patent
Hsu et al.

(10) Patent No.: US 7,659,168 B2
(45) Date of Patent: Feb. 9, 2010

(54) EFUSE AND METHODS OF MANUFACTURING THE SAME

(75) Inventors: Louis Lu-Chen Hsu, Fishkill, NY (US); Jack A. Mandelman, Flat Rock, NC (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 461 days.

(21) Appl. No.: 11/266,740

(22) Filed: Nov. 3, 2005

(65) Prior Publication Data

US 2007/0099326 A1    May 3, 2007

(51) Int. Cl.
*H01L 21/336* (2006.01)

(52) U.S. Cl. .............. 438/281; 257/E23.149

(58) Field of Classification Search ........ 438/132, 438/215, 281, 333, 467, 601; 257/209, 529, 257/E23.149
See application file for complete search history.

(56) References Cited

U.S. PATENT DOCUMENTS

| | | | |
|---|---|---|---|
| 6,088,256 A | 7/2000 | Worley et al. | |
| 6,258,700 B1 | 7/2001 | Bohr et al. | |
| 6,410,367 B2 * | 6/2002 | Marr et al. | 438/132 |
| 6,580,156 B1 | 6/2003 | Ito et al. | |
| 6,621,138 B1 | 9/2003 | Alter | |
| 6,933,591 B1 | 8/2005 | Sidhu et al. | |
| 6,956,277 B1 * | 10/2005 | Wu et al. | 257/529 |
| 7,323,761 B2 * | 1/2008 | Park et al. | 257/530 |
| 2005/0212080 A1 | 9/2005 | Wu et al. | |
| 2007/0026579 A1 * | 2/2007 | Nowak et al. | 438/149 |

* cited by examiner

*Primary Examiner*—David Vu
(74) *Attorney, Agent, or Firm*—Dugan & Dugan, PC; Roy W. Truelson

(57) ABSTRACT

In a first aspect, a first apparatus is provided. The first apparatus is an eFuse including (1) a semiconducting layer above an insulating oxide layer of a substrate; (2) a diode formed in the semiconducting layer; and (3) a silicide layer formed on the diode. Numerous other aspects are provided.

9 Claims, 20 Drawing Sheets

EFUSE AND METHODS OF MANUFACTURING THE SAME

FIELD OF THE INVENTION

The present invention relates generally to semiconductor device manufacturing, and more particularly to an eFuse and methods of manufacturing the same.

BACKGROUND

A conventional eFuse may include a silicide layer on a polysilicon layer, which serves as a resistor. To program the conventional eFuse, a current may be driven (e.g., by one or more transistors) in a first direction from a cathode to an anode of the conventional eFuse. Driving current in the first direction through the eFuse forms a gap in the silicide layer, thereby exposing a portion of the polysilicon layer. The state of the programmed eFuse may be sensed by attempting to drive a current in a second direction from the anode to the cathode. The resistance of the path through which the current is driven is dependent on the length of the gap formed in the silicide layer during programming. Due to variations in operational parameters of transistors and/or control of voltage levels employed to program such conventional eFuses, the length of the respective silicide layer gaps formed in such eFuses may vary. Therefore, resistances of such conventional eFuses vary. Consequently, improved or gap invariant eFuses and methods of manufacturing the same are desired.

SUMMARY OF THE INVENTION

In a first aspect of the invention, a first apparatus is provided. The first apparatus is an eFuse including (1) a semiconducting layer above an insulating oxide layer of a substrate; (2) a diode formed in the semiconducting layer; and (3) a silicide layer (e.g., a shunting silicide layer) formed on the diode.

In a second aspect of the invention, a first method is provided for manufacturing an eFuse. The first method includes the steps of (1) providing a substrate including a layer of insulating oxide and a semiconducting layer above the layer of insulating oxide; (2) forming a diode in the semiconducting layer; and (3) forming a layer of silicide (e.g., a shunting layer of silicide) above the diode. Numerous other aspects are provided in accordance with these and other aspects of the invention.

Other features and aspects of the present invention will become more fully apparent from the following detailed description, the appended claims and the accompanying drawings.

DETAILED DESCRIPTION

The present invention provides an improved eFuse and methods of manufacturing the same. More specifically, the present invention provides an eFuse with a resistance that is independent of a length of a gap formed in a silicide layer of the eFuse during programming, and provides methods of manufacturing such an eFuse. The eFuse may include a diodic element below the silicide. In some embodiments, the diodic element may comprise polysilicon, single crystal silicon on insulator, or another suitable semiconducting material. The diodic element during a read is reverse biased, and therefore, provides a high resistance, when the state of the programmed eFuse is sensed. The resultant resistance of the eFuse is dependant upon the diode formation and becomes independent of the length of the gap formed in the silicide layer during programming. The reverse diode IV characteristics defines a resistance that is orders of magnitude higher than a single doped polysilicon line length encompassing the portion of the diode. Therefore, the eFuse diode resistance is both highly reproducible and independent of the silicide gap length. Consequently, resistances of eFuses manufactured in accordance with an embodiment of the present invention may not vary (e.g., as much as conventional single doped semiconducting eFuses). In this manner, the present invention provides improved eFuses and methods of manufacturing the same.

Figure 1:
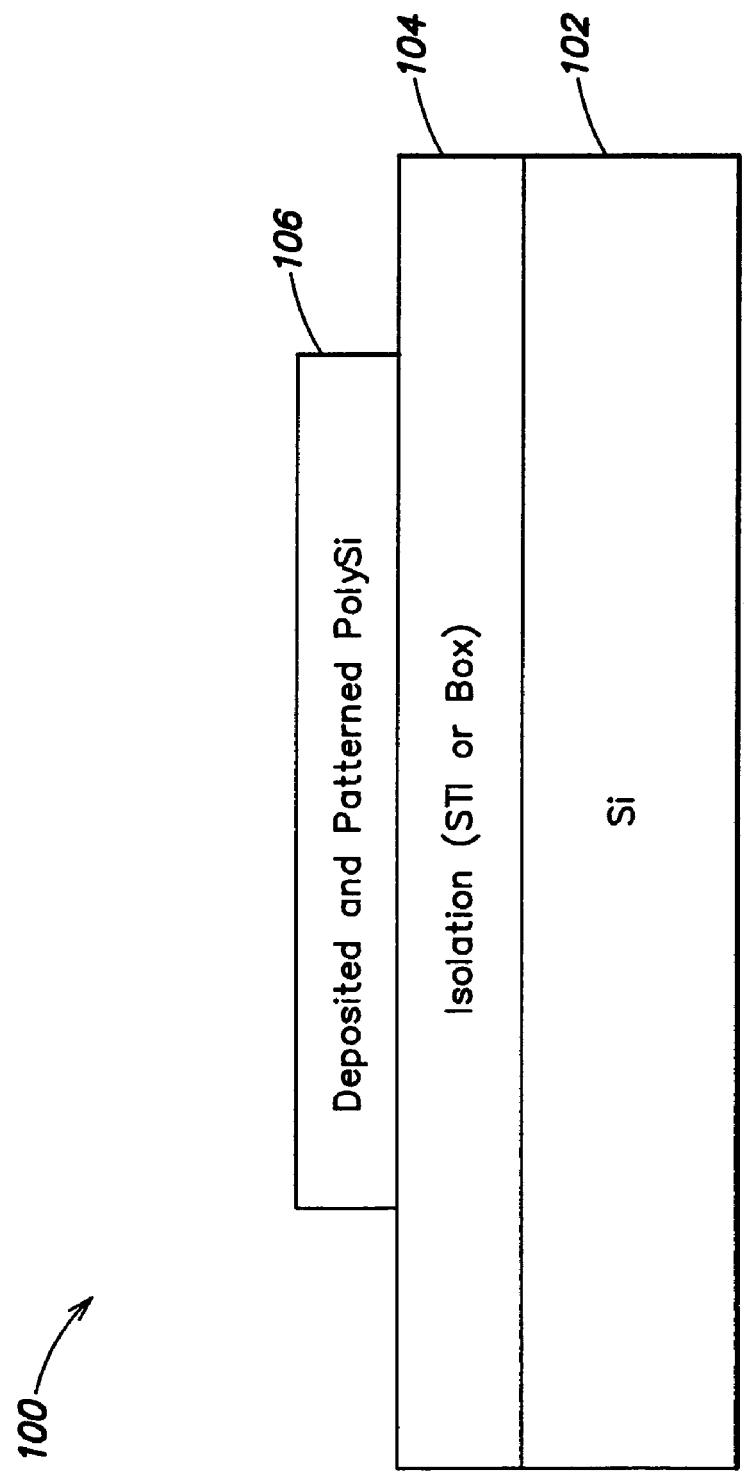
FIG. 1 illustrates a cross-sectional side view of a step of a first exemplary method of manufacturing a first exemplary eFuse in which a polysilicon (or single crystal silicon layer) is patterned on a substrate in accordance with an embodiment of the present invention.

FIG. 1 illustrates a cross-sectional side view of a step of a first exemplary method of manufacturing a first exemplary eFuse in which a polysilicon or single crystal silicon layer is patterned on a substrate in accordance with an embodiment of the present invention. With reference to FIG. 1, the first exemplary eFuse (600 in FIG. 6) may be manufactured from a substrate 100 including a silicon layer 102 (e.g., a bulk substrate). The substrate 100 may include a layer 104 of insulating oxide formed on the silicon layer 102, and a layer 106 of polysilicon (e.g., gate conductor polysilicon) or another suitable semiconducting material formed on the insulating oxide layer. In this manner, the insulating oxide layer 104 may be a buried oxide (BOX) layer or a shallow trench isolation (STI) oxide layer. Chemical vapor deposition (CVD) or another suitable method may be employed to form the polysilicon layer 106 on the substrate 100. Thereafter, reactive ion etching (RIE) or another suitable method may be employed to selectively remove portions of the polysilicon layer 106, thereby patterning the polysilicon. As described below, subsequent substrate processing forms the polysilicon layer 106 into one or more portions of the first exemplary eFuse.

Figure 2:
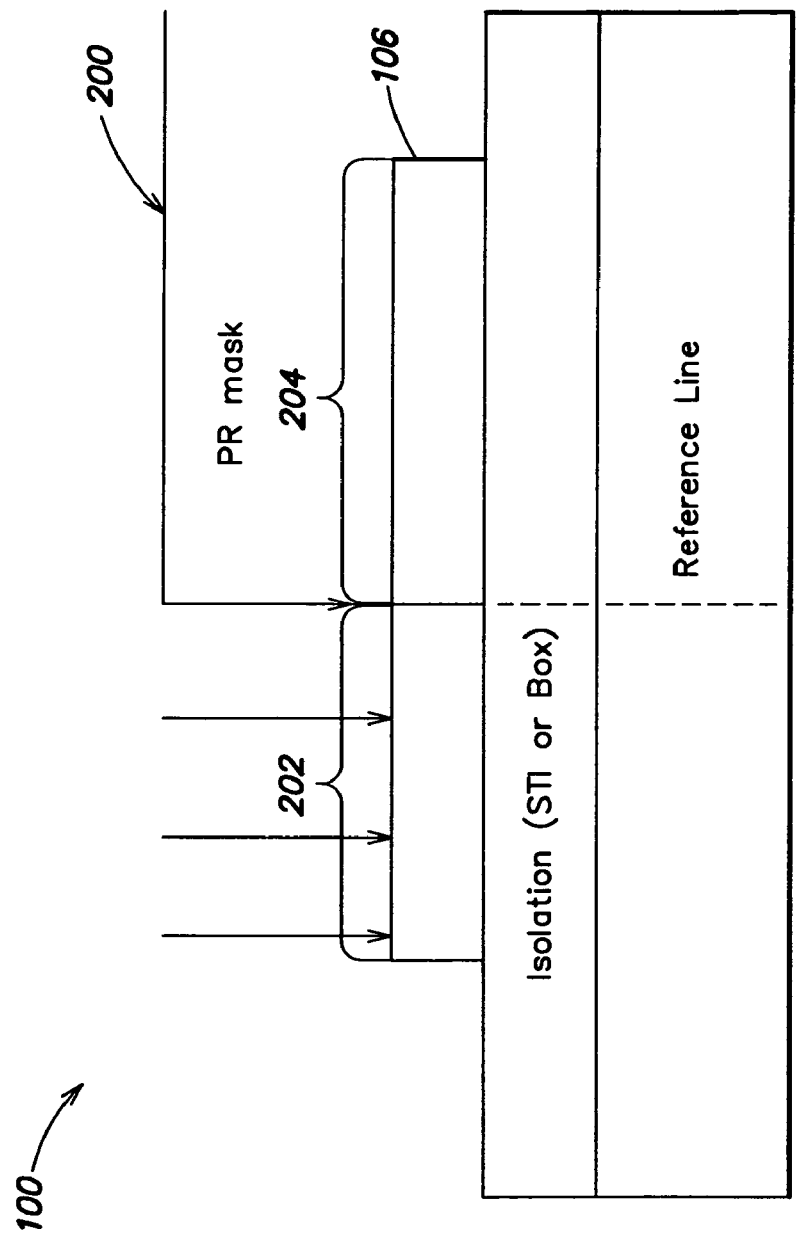
FIG. 2 illustrates a cross-sectional side view of a step of the first exemplary method of manufacturing the first exemplary eFuse in which impurity atoms are implanted into a portion of the polysilicon layer to form an N+ region in accordance with an embodiment of the present invention.

FIG. 2 illustrates a cross-sectional side view of a step of the first exemplary method of manufacturing the first exemplary eFuse in which impurity atoms are implanted into a portion of the polysilicon layer to form an N+ region in accordance with an embodiment of the present invention. With reference to FIG. 2, a spin-on technique or another suitable method may be employed to deposit a photoresist layer on the substrate 100. Photolithography using the resist and appropriate masking or another suitable method may be employed to pattern the photoresist layer into a first mask (e.g., block mask) 200. In this manner, a top surface of a first portion 202 of the polysilicon layer 106 may be exposed and a top surface of a second portion 204 of the polysilicon layer 106, which is below the mask 200, may not be exposed.

An implant process (e.g., a unique or standard logic implant process) or another suitable method may be employed to implant N+ impurity atoms or the like (e.g., dopant) into the polysilicon layer 106. More specifically, the implant (e.g., logic N+ polysilicon and diffusion implant) may form a first highly-doped region having a first polarity (e.g., an N+ doped region) in the exposed portion (e.g., first portion 202) of the polysilicon layer 106. However, the mask 200 may prevent the impurity atoms from reaching the second portion 204 of the polysilicon layer 106 during implanting, thereby protecting the second portion 204. Further, the mask 200 may protect one or more MOSFET gates during implanting. Once the N+ doped region is formed, a photoresist stripper bath or another suitable method may be employed to strip the first mask 200 from the substrate 100.

Figure 3:
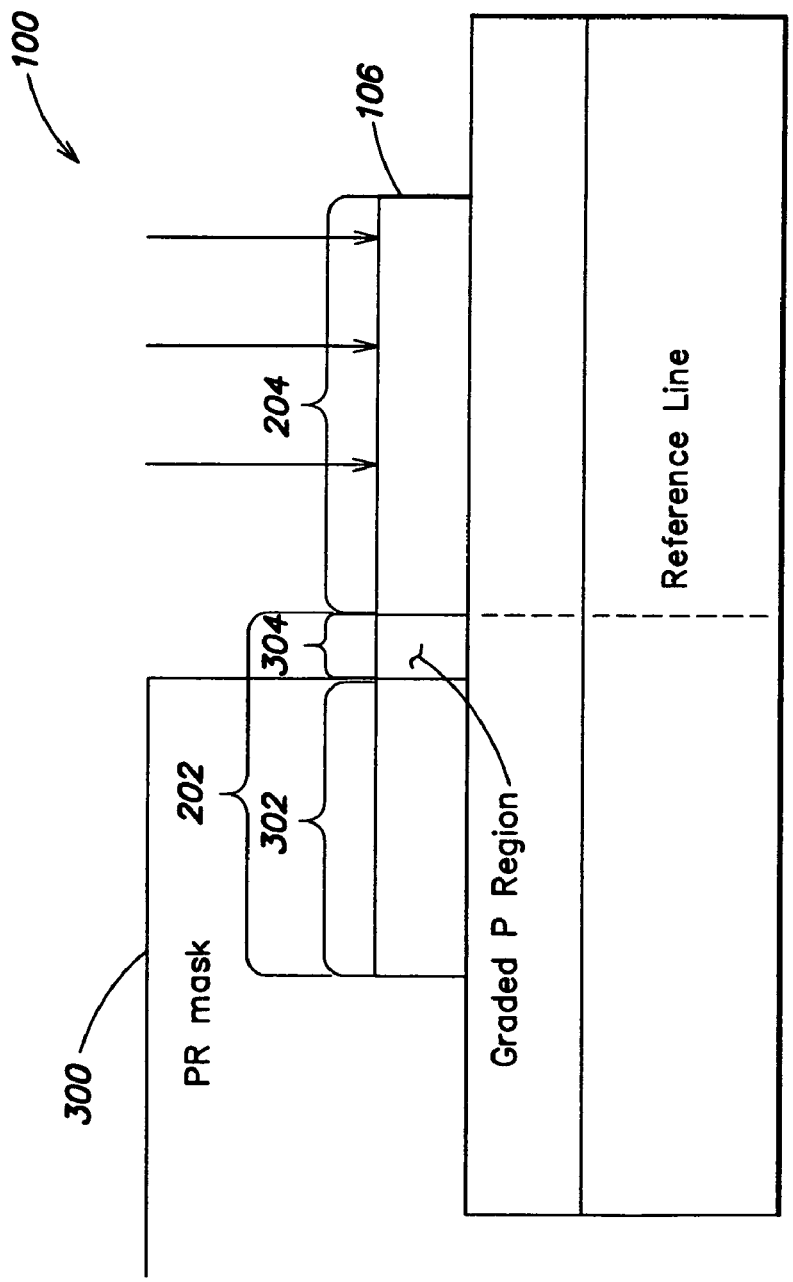
FIG. 3 illustrates a cross-sectional side view of a step of the first exemplary method of manufacturing the first exemplary eFuse in which impurity atoms are implanted into a portion of the polysilicon layer to form a P+ region and a P− region in accordance with an embodiment of the present invention.

FIG. 3 illustrates a cross-sectional side view of a step of the first exemplary method of manufacturing the first exemplary eFuse in which impurity atoms are implanted into a portion of the polysilicon layer to form a P+ region and a P− region in accordance with an embodiment of the present invention. With reference to FIG. 3, a spin-on technique or another suitable method may be employed to deposit a photoresist layer on the substrate 100. Photolithography using the resist and appropriate masking or another suitable method may be employed to pattern the photoresist layer into a second mask (e.g., block mask) (not shown). The second mask may be positioned such that the second mask protects the first portion 202 of the polysilicon layer 106 and does not protect (e.g., exposes) the second portion 204 of the polysilicon layer 106. In this manner, the second mask may be the inverse of the first mask 200.

An implant process or another suitable method may be employed to implant P+ impurity atoms or the like (e.g., dopant) into the polysilicon layer 106. More specifically, the implant (e.g., logic P+ polysilicon and diffusion implant) may form a second highly-doped region having a second, opposite polarity (e.g., a P+ doped region) in the exposed portion (e.g., second portion 204) of the polysilicon layer 106. However, the second mask may prevent the impurity atoms from reaching the first portion 202 of the polysilicon layer 106 during implanting, thereby protecting the first portion 202. Once the P+ doped region is formed a photoresist stripper bath or another suitable method may be employed to strip the second mask from the substrate 100.

A third mask 300 may be formed in a manner similar to that employed to form the first and second masks. More specifically, a spin-on technique or another suitable method may be employed to deposit a photoresist layer on the substrate 100. Photolithography using the resist and appropriate masking or another suitable method may be employed to pattern the photoresist layer into the third mask (e.g., block mask). The third mask 300 may be positioned such that the third mask 300 protects a first sub-portion 302 of the first portion 202 of the polysilicon layer 106 and does not protect (e.g., exposes) a second sub-portion 304 of the first portion 202 and the second portion 204 of the polysilicon layer 106. In this manner, the third mask 300 may be a shifted version of the inverse of the first mask 200 (e.g., the first mask 200 with a +X sigma). An implant process or another suitable method may be employed to implant P+ impurity atoms or the like (e.g., dopant) into the polysilicon layer 106. The third mask 300 allows a polysilicon layer region exposed while implanting N+ impurity atoms therein to overlap the polysilicon region exposed while implanting the P+ impurity atoms therein. The impurity atom dosage may be selected such that the doping of the second portion 204 of the polysilicon layer 106 is unaffected or slightly affected. In this manner, the implant (e.g., logic P+ polysilicon and diffusion implant) may form a lightly-doped region such as a P− doped region (e.g., a graded region with a P− to P+ transition) in an exposed portion (e.g., the second sub-portion 304 of the first portion 202) of the polysilicon layer 106. The third mask 300 may prevent the impurity atoms from reaching the first sub-portion 302 of the polysilicon layer 106 during implanting, thereby protecting the first sub-portion 302. Once the P− doped region is formed, a photoresist stripper bath or another suitable method may be employed to strip the third mask 300 from the substrate 100.

Alternatively, the P− region of the substrate 100 may be formed without using a mask. For example, after stripping the second mask from the substrate 100, an implant process or another suitable method may be employed to implant P+ impurity atoms or the like (e.g., dopant) into the polysilicon layer 106. Although the first sub-portion 302 of the first portion 202 and the second portion 204 of the polysilicon layer 106 (along with the second sub-portion 304) are exposed during implanting, an impurity atom dosage may be selected such that the doping of the first sub-portion 302 and second portion 206 is unaffected or slightly affected. In this manner, the implant (e.g., logic P+ polysilicon and diffusion implant) may form a P− doped region in the second sub-portion 304 of the first portion 202 of the polysilicon layer 106.

Figure 4:
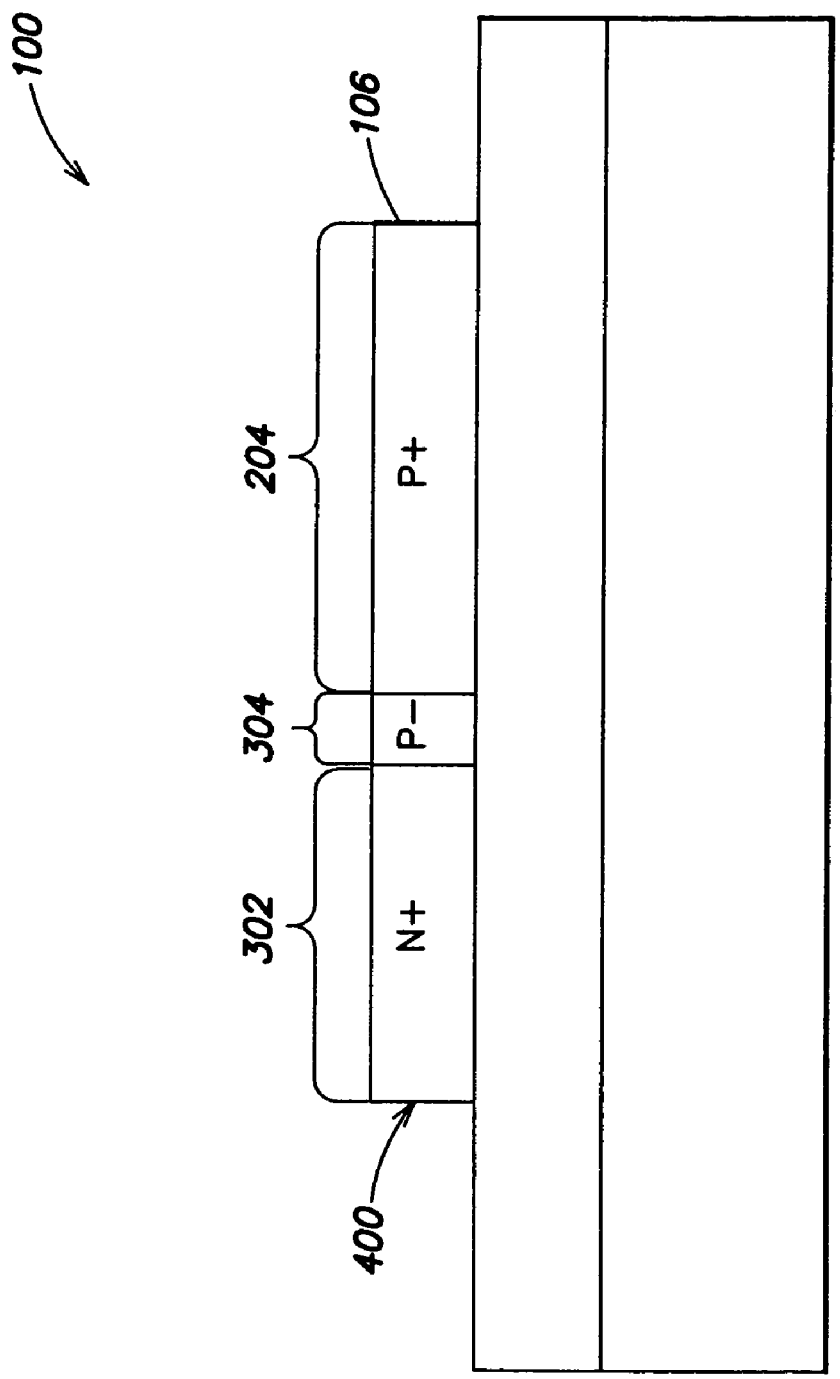
FIG. 4 illustrates a cross-sectional side view of a step of the first exemplary method of manufacturing the first exemplary eFuse in which the substrate undergoes annealing in accordance with an embodiment of the present invention.

FIG. 4 illustrates a cross-sectional side view of a step of the first exemplary method of manufacturing the first exemplary eFuse in which the substrate undergoes annealing in accordance with an embodiment of the present invention. With reference to FIG. 4, the substrate 100 may undergo annealing at a temperature of about 900° C. to about 1100° C. for about 10 s to about 30 min depending on a desired lateral grading (e.g., P− to P+ transition) of the doped regions. However, a larger or smaller and/or different temperature range may be employed. Further, the substrate 100 may undergo annealing for a longer or shorter time period. The high temperature of annealing may activate the implanted dopants N+ dopants, P+ dopants, P− dopants, thereby enabling such dopants to diffuse through respective implant regions 302, 204, 304. During annealing one or more implant regions, such as the P− region, may expand. In this manner, a diode 400, having a N+P− junction where the first sub-portion 302 couples to the second sub-portion 304, may be formed in the polysilicon layer 106.

Figure 5:
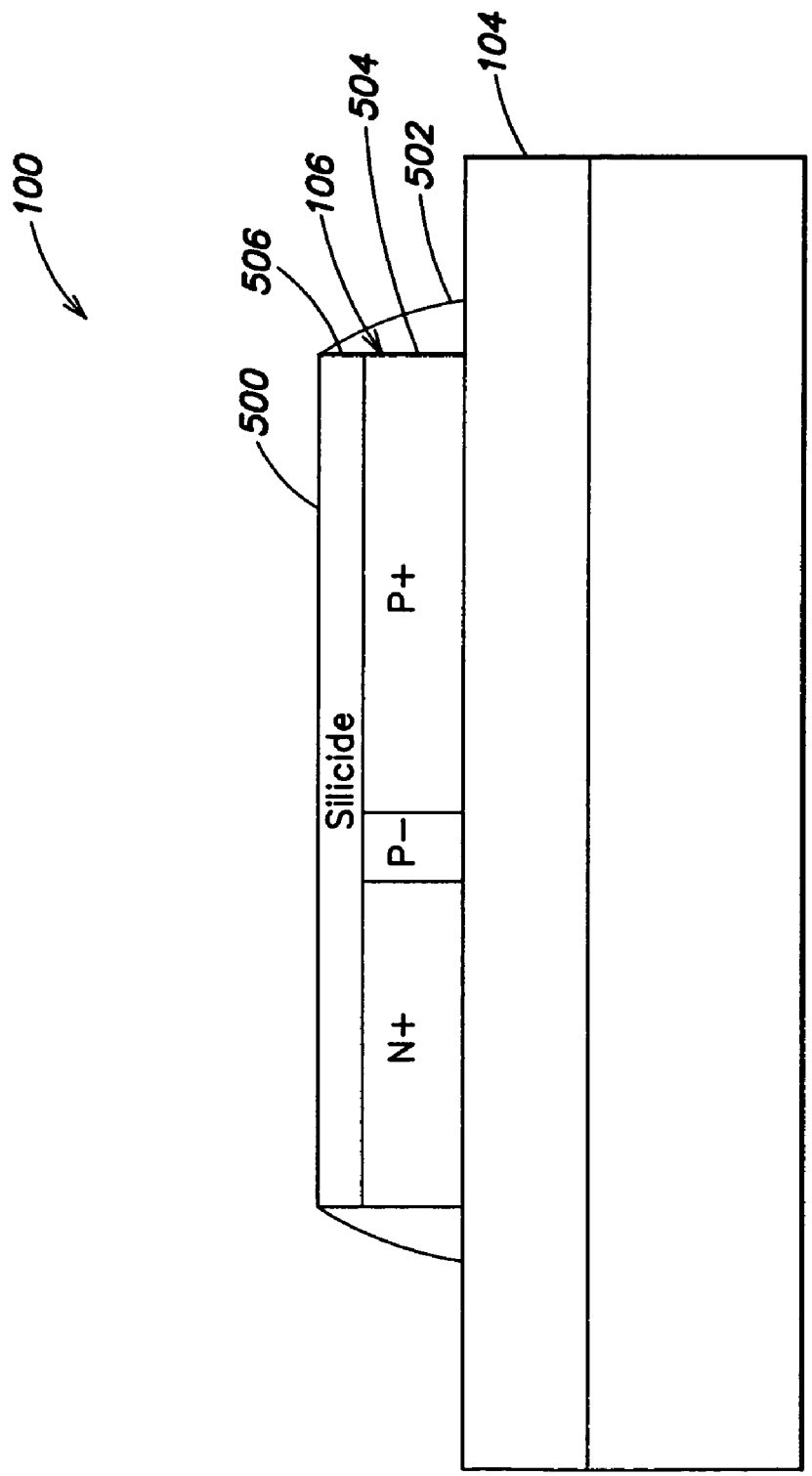
FIG. 5 illustrates a cross-sectional side view of a step of the first exemplary method of manufacturing the first exemplary eFuse in which spacers and a shunting silicide layer are formed on the substrate in accordance with an embodiment of the present invention.

FIG. 5 illustrates a cross-sectional side view of a step of the first exemplary method of manufacturing the first exemplary eFuse in which a silicide layer and spacers are formed on the substrate in accordance with an embodiment of the present invention. With reference to FIG. 5, CVD or another suitable method may be employed to deposit (e.g., conformally) a layer of shunting silicide or another suitable material on the substrate 100. Thereafter, RIE or another suitable method may be employed to remove portions of such silicide layer (e.g., selective to polysilicon). In this manner, a silicide layer 500 may be formed on the polysilicon layer 106. As described below, the silicide layer 500 may serve as a fuse element of the first exemplary eFuse (600 in FIG. 6). In some embodiments, the silicide layer 500 may be about 300 angstroms to about 800 angstroms thick (although a larger or smaller and/or different thickness range may be employed). The silicide layer 500 may be formed on the polysilicon layer 106 during gate conductor silicidation. Alternatively, the silicide layer 500 may be formed as an independent processing step. For example, if a shallower silicide layer is desired above the polysilicon layer 106, CVD or another suitable method followed by RIE or another suitable method may be employed to form a layer of insulating material on the polysilicon layer 106 during gate conductor silicidation. Thereafter, the shallower silicide layer may be formed on the polysilicon layer 106 in the manner described above.

CVD or another method may be employed to deposit (e.g., conformally) a layer of oxide (e.g., silicon oxide) or another suitable insulating material (e.g., silicon nitride) on the substrate 100. Thereafter, RIE or another suitable method may be employed to remove portions of such oxide layer selective to silicide. In this manner, one or more oxide spacers 502 may be formed on corresponding sidewalls 504 (e.g., vertical sidewalls) of the polysilicon layer 106 and/or corresponding sidewalls 506 of the silicide layer 500.

In some embodiments, CVD or another method may be employed to deposit (e.g., conformally) a thin barrier layer on the substrate 100 before forming the one or more oxide spacers 502. The barrier layer may serve to protect the insulating oxide layer 104 while the one or more oxide spacers are formed.

The substrate 100 may undergo annealing to activate silicide in the silicide layer 500. Further, in some embodiments, source and drain implant regions of one or more MOSFETs (e.g., standard NMOS and/or PMOS transistors) being manufactured on the substrate 100 may be formed while the silicide layer 500 and/or oxide spacers 502 are formed (although such implant regions may be formed sooner or later).

Figure 6:
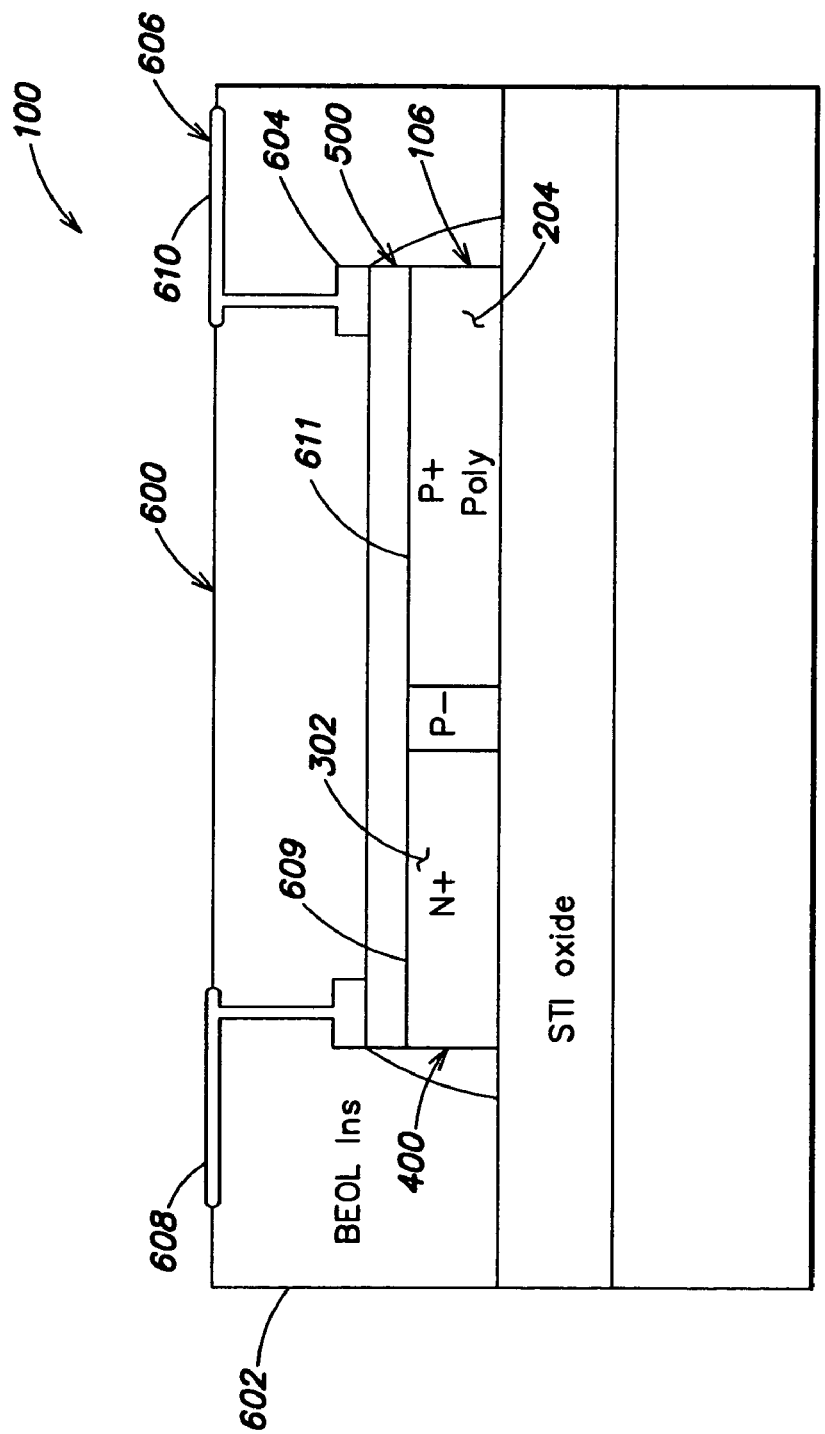
FIG. 6 illustrates a cross-sectional side view of a step of the first exemplary method of manufacturing the first exemplary eFuse in which interlevel dielectrics, vias and wiring are formed on the substrate in accordance with an embodiment of the present invention.

FIG. 6 illustrates a cross-sectional side view of a step of the first exemplary method of manufacturing the first exemplary eFuse 600 in which interlevel dielectrics, vias and wiring are formed on the substrate in accordance with an embodiment of the present invention. With reference to FIG. 6, interlevel dielectrics may be deposited or formed on the substrate 100. For example, a back end of line (BEOL) insulating oxide layer 602 or another suitable material may be formed on the substrate 100 such that the BEOL insulating oxide layer 602 surrounds the polysilicon and silicide layers 106, 500 of the eFuse 600. Contact openings or vias may be formed in the BEOL insulating oxide layer 602. Contacts 604 may be formed in such vias, respectively. Further, one or more levels of wiring 606 may be formed on the substrate 100. For example, first wiring 608 (e.g., a first terminal) of the eFuse 600 may couple to a region of the diode 400, such as the first sub-portion 302, that serves as a cathode 609 and second wiring 610 (e.g., a second terminal) of the eFuse 600 may couple to a region of the diode 400, such as the second portion 204, that serves as an anode 611. Methods of forming interlevel dielectrics, vias and wiring are known to one of skill in the art. Therefore, such methods are not described in detail herein. In this manner, the first exemplary eFuse 600 may be formed. More specifically, an eFuse 600 including a shallow silicide layer 500 serving as a fuse element may be formed on a lateral polysilicon diode 400.

Figure 7:
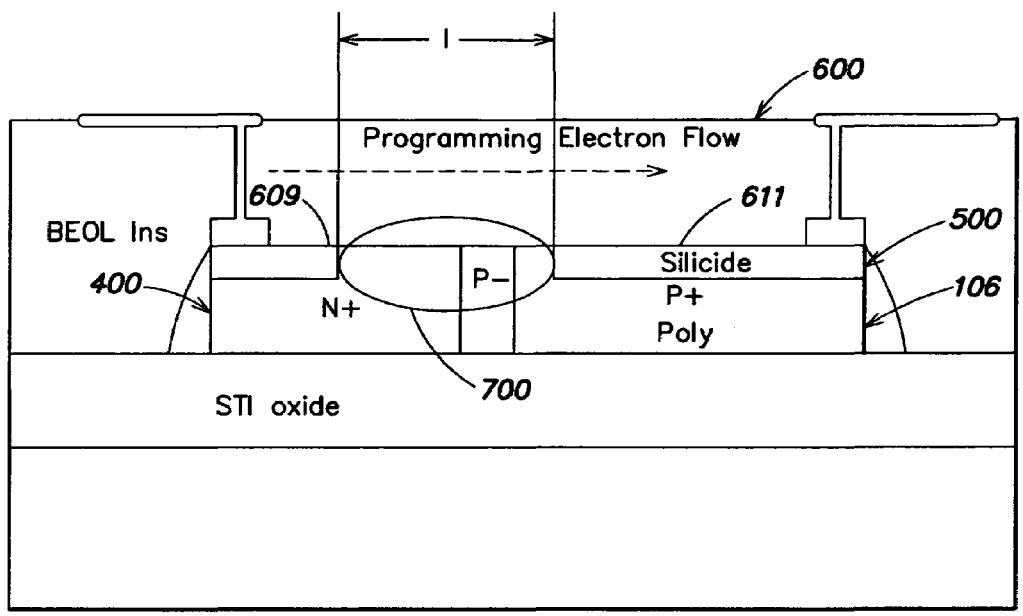
FIG. 7 illustrates a cross-sectional side view of the first exemplary eFuse of FIG. 6 after programming in accordance with an embodiment of the present invention.
Figure 8:
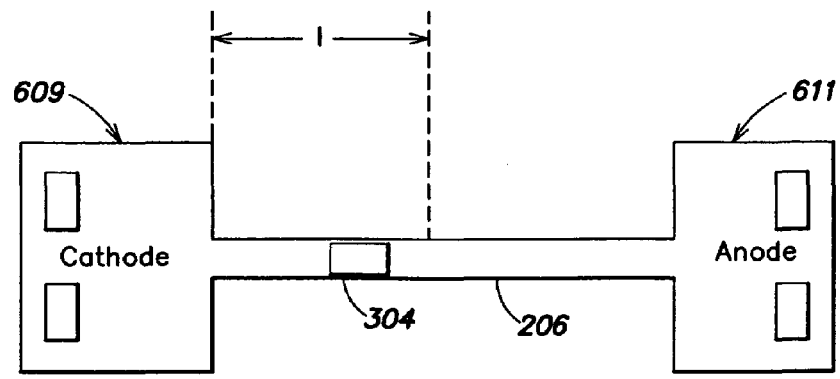
FIG. 8 illustrates a top view of a cathode and an anode above the polysilicon layer of the first exemplary eFuse of FIG. 7 after programming in accordance with an embodiment of the present invention.

FIG. 7 illustrates a cross-sectional side view of the first exemplary eFuse of FIG. 6 after programming and FIG. 8 illustrates a top view of a cathode 609 and an anode 611 above the polysilicon layer 106 of the first exemplary eFuse 600 of FIG. 7 after programming in accordance with an embodiment of the present invention. With reference to FIGS. 7 and 8, the first exemplary eFuse 600 may be programmed by biasing the cathode 609 negatively with respect to the anode 611. For example, a more negative voltage may be applied to the cathode 609 than the anode 611 of the diode 400. Consequently, electrons in the silicide layer 500 may flow from the cathode 609 to the anode 611. Such electron flux (e.g., silicide electromigration) may cause a gap 700 to form in the silicide layer 500. For example, the silicide layer 500 may open first near the contact to the cathode 609 and proceed towards the anode 611. The location of the lateral np junction (e.g., where the N+ region couples to the P− region) in the polysilicon layer 500 may have been selected such that the pn junction will always be uncovered (e.g., exposed) during eFuse programming. The gap 700 may have a length l of about 0.4 um to about 0.9 um (although a larger or smaller and/or different length range may be employed). The gap length may be a function of the applied power used to migrate the silicide.

Consequently, after programming, current driven in the eFuse 600 (e.g., between the cathode 609 and anode 611) may pass through the diode 400 formed in the polysilicon layer 106. After programming, for example, during sensing (e.g., a read operation), the cathode 609 may be biased positively with respect to the anode 611. For example, a more positive voltage may be applied to the cathode 609 than the anode 611 of the diode 400. Therefore, the diode 400 is reverse biased. The current through the eFuse 600 may be limited to a leakage current of the reverse biased diode 400. More specifically, the current through the eFuse 600 may be independent of the voltage applied across the eFuse 600. When reverse biased, the structure of the diode 400 may perform a blocking action, thereby providing a highly-reproducible predetermined resistance (e.g., a resistance based on the diode structure). Therefore, during sensing, after the eFuse 600 is programmed so that a gap 700, which exposes the N+P− junction of the diode 400, forms in the silicide layer 500, the eFuse 600 may provide a highly-reproducible predetermined current (e.g., a current based on the diode structure). In this manner, the resistance of and current through the eFuse 600 during sensing may be independent of the silicide electromigration gap length l formed during eFuse programming. In contrast, conventional eFuses may include a resistor below a silicide electromigration gap formed during programming. Therefore, the resistance of and current through such eFuses during sensing depends on the length of the gap l.

Through use of the first exemplary method of manufacturing the first exemplary eFuse 600, a plurality of eFuses 600 may be manufactured with a highly-reproducible resistance and current during sensing. The eFuses 600 may include silicide fuse elements over lateral polysilicon diodes, respectively.

Figure 9:
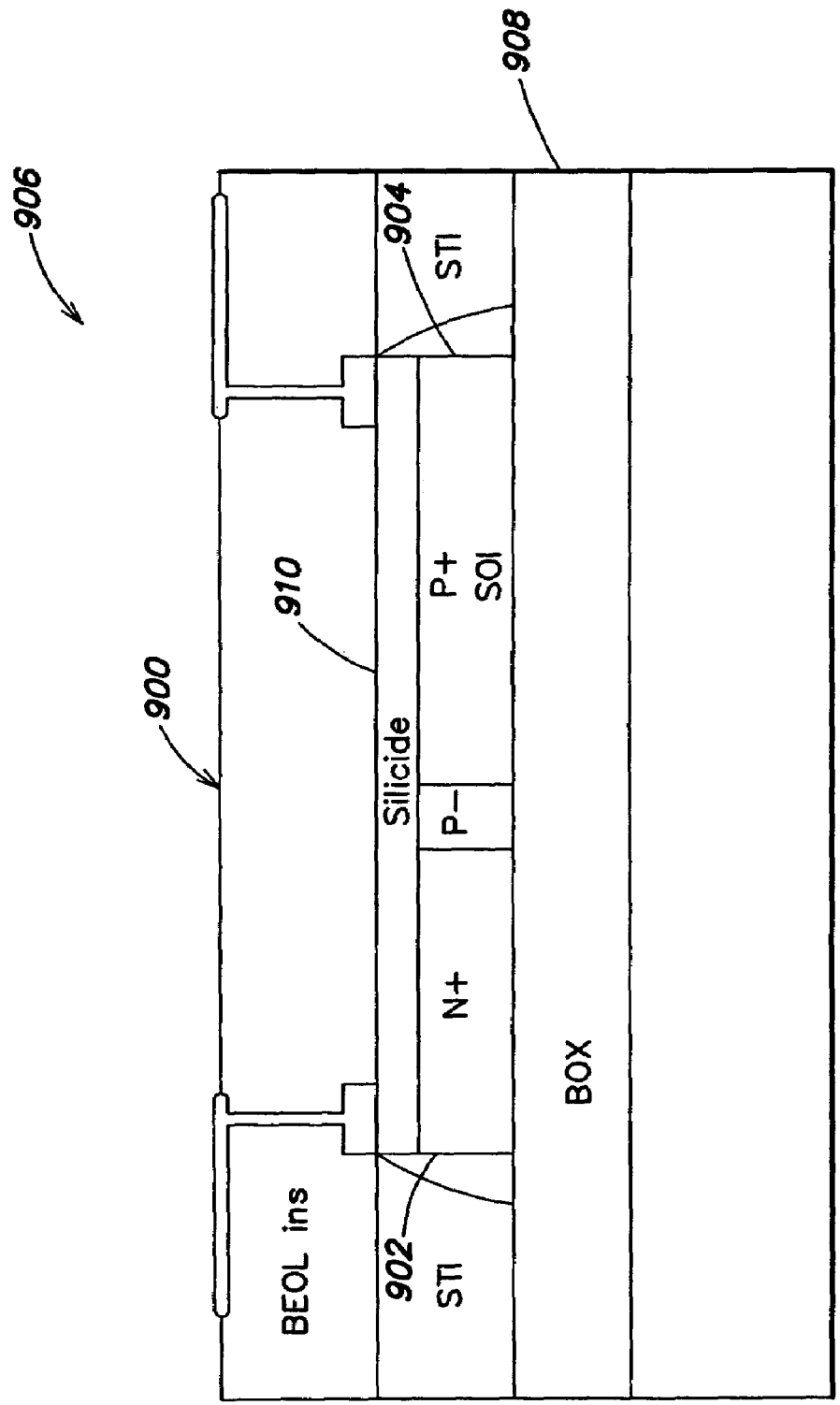
FIG. 9 illustrates a cross-sectional side view of a second exemplary eFuse in accordance with an embodiment of the present invention.

FIG. 9 illustrates a cross-sectional side view of a second exemplary eFuse in accordance with an embodiment of the present invention. With reference to FIG. 9, the second exemplary eFuse 900 may be similar to the first exemplary eFuse 600. However, in contrast to the first exemplary eFuse 600, the second exemplary eFuse 900 may include a diodic element (e.g., a diode 902) formed in a silicon-on-insulator (SOI) layer 904 (or island) of a substrate 906. More specifically, the substrate 906 may include a layer of single crystal silicon layer 904 above an insulating oxide (e.g., buried oxide (BOX)) layer 908. However, the diodic element may be formed in a layer of another suitable material. The second exemplary eFuse 900 may include a layer of silicide 910, which may serve as a fuse element, formed on the SOI layer 904.

Compared to the first exemplary eFuse 600, lateral diffusion of implanted dopants may be slower in the single crystal silicon of the second exemplary eFuse 900 than in the polysilicon of the first exemplary eFuse 600. A slower diffusion rate (e.g., lower diffusivity) may be desired for certain applications (e.g., depending on process integration considerations).

The second exemplary eFuse 900 may be manufactured using a first exemplary method similar to the first exemplary method of manufacturing the first exemplary eFuse 600. However, in contrast to the first exemplary method of manufacturing the first eFuse 600, the first exemplary method of manufacturing the second eFuse 900 forms the second exemplary eFuse 900 from a substrate 906 including a silicon layer (e.g., a bulk substrate), a layer 908 of insulating oxide (e.g., buried oxide (BOX)) formed on the silicon layer, and an SOI layer 904 (e.g., a layer of single crystal silicon) or another suitable material formed on the insulating oxide layer 908. The first exemplary method of manufacturing the second exemplary eFuse 900 may pattern the SOI layer 904 and form portions (e.g., the diodic element) of the eFuse 902 in such patterned SOI layer 904. Processing of the substrate 906 may be similar to the steps of the first exemplary method of manufacturing the first exemplary eFuse 600 illustrated in FIGS. 1-6, but may differ in the following ways. Following the patterning of the SOI layer 904, which serves as an area including active silicon (e.g., RX level), and prior to gate processing, N+ and P+ implants are made into respective regions of the SOI layer 904, in a manner which is similar to steps of the first exemplary method of manufacturing the first exemplary eFuse 600 illustrated in FIGS. 2 and 3. During such implanting, regions of one or more MOSFETS being manufactured on the substrate 906 may be protected by a block mask formed from a patterned photoresist layer.

Thereafter, normal gate processing for the MOSFETs may be performed. For example, such gate processing may include deposition and patterning of a gate conductor, extension, halo implants, spacer formation, and source-drain implantation. During gate processing, the implanted regions of the SOI layer 904 may be protected by a photoresist layer patterned by one or more block masks. Thereafter, all gate conductor material may be etched off of the implanted regions of the SOI layer 904, and CVD or another suitable method may be employed to form the layer 910 of silicide on the SOI layer 904. Alternatively, the silicide layer 910 may be formed during a different time. For example, if a shallower silicide layer is desired above the SOI layer 904, CVD or another suitable method followed by RIE or another suitable method may be employed to form a layer of insulating material on the SOI layer 904 during gate conductor silicidation. Thereafter, the shallower silicide layer may be formed on the SOI layer 904 in the manner described above.

Figure 10:
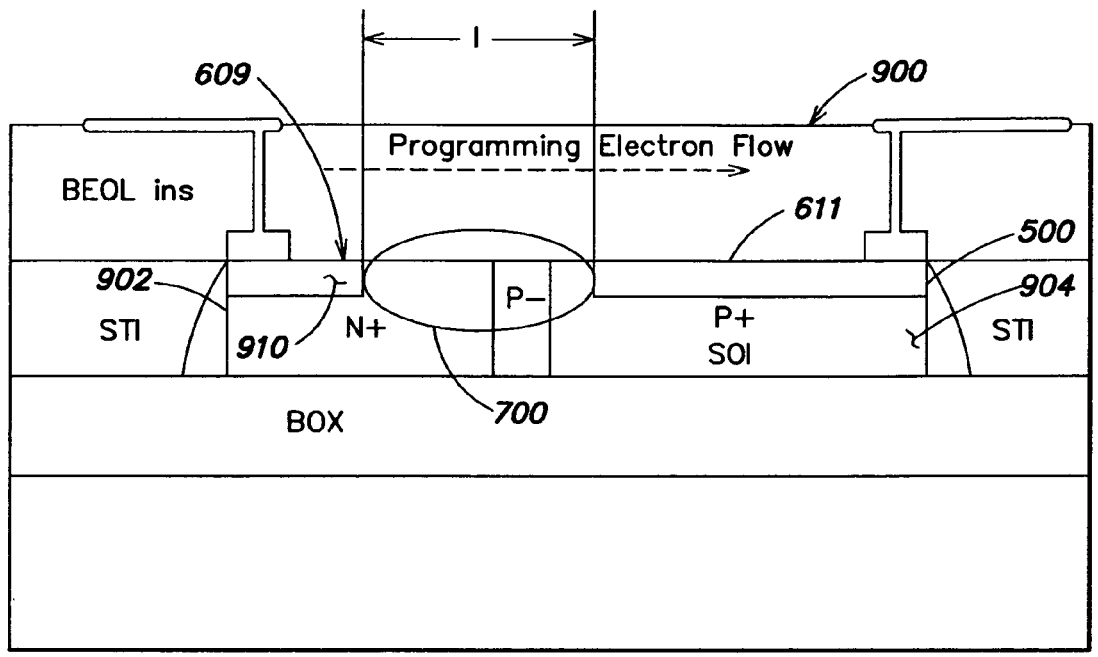
FIG. 10 illustrates a cross-sectional side view of the second exemplary eFuse of FIG. 9 after programming in accordance with an embodiment of the present invention.
Figure 11:
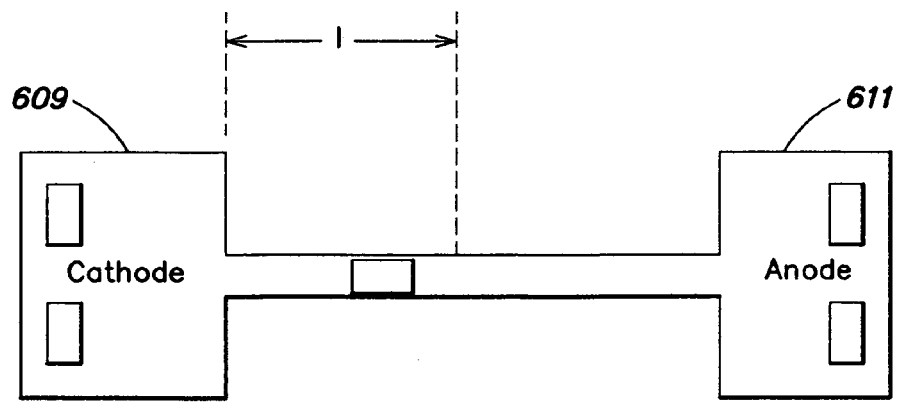
FIG. 11 illustrates a top view of a cathode and an anode above an SOI layer of the second exemplary eFuse of FIG. 10 after programming in accordance with an embodiment of the present invention.

FIG. 10 illustrates a cross-sectional side view of the second exemplary eFuse of FIG. 9 after programming and FIG. 11 illustrates a top view of a cathode 609 and an anode 611 above an SOI layer 904 of the second exemplary eFuse 900 of FIG. 10 after programming in accordance with an embodiment of the present invention. With reference to FIGS. 10-11, similar to the first exemplary eFuse 600, the second exemplary eFuse 900 may be programmed by biasing the cathode 609 negatively with respect to the anode 611. For example, a more negative voltage may be applied to the cathode 609 than the anode 611 of the diode 902. Consequently, electrons in the silicide layer 910 may flow from the cathode 609 to the anode 611. Such electron flux (e.g., silicide electromigration) may cause a gap 700 to form in the silicide layer 500. For example, the silicide layer 500 may open first near the contact to the cathode 609 and proceed towards the anode 611. The location of the lateral N+P− junction (e.g., where the N+ region couples to the P− region) in the SOI layer 904 may have been selected such that the N+P− junction will always be uncovered (e.g., exposed during eFuse programming. The gap 700 may have a length l of about 0.4 um to about 0.9 um (although a larger or smaller and/or different length range may be employed).

Consequently, after programming, current driven in the eFuse 900 (e.g., between the cathode 609 and anode 611) may pass through the diode 902 formed in the SOI layer 904. After programming, for example, during sensing (e.g., a read operation), the cathode 609 may be biased positively with respect to the anode 611. A more positive voltage may be applied to the cathode 609 than the anode 611 of the diode 902. Therefore, the diode 902 is reverse biased. The current through the eFuse 900 may be limited to a leakage current of the reverse biased diode 902. More specifically, the current through the eFuse 900 may be independent of a voltage applied across the eFuse 900. When reverse biased, the structure of the diode 902 may perform a blocking action, thereby providing a highly-reproducible predetermined resistance (e.g., a resistance based on the diode structure). Therefore, during sensing, after the eFuse 900 is programmed so that a gap 700, which exposes the N+P− junction of the diode 902, forms in the silicide layer 910, the eFuse 900 may provide a highly-reproducible predetermined current (e.g., a current based on the diode structure). In this manner, the resistance of and current through the eFuse 900 during sensing may be independent of the silicide electromigration gap length l formed during eFuse programming.

Through use of the first exemplary method of manufacturing the second exemplary eFuse 900, a plurality of eFuses 900 may be manufactured with a highly-reproducible resistance and current during sensing. The eFuses 900 may include silicide fuse elements over lateral SOI diodes, respectively.

Figure 12:
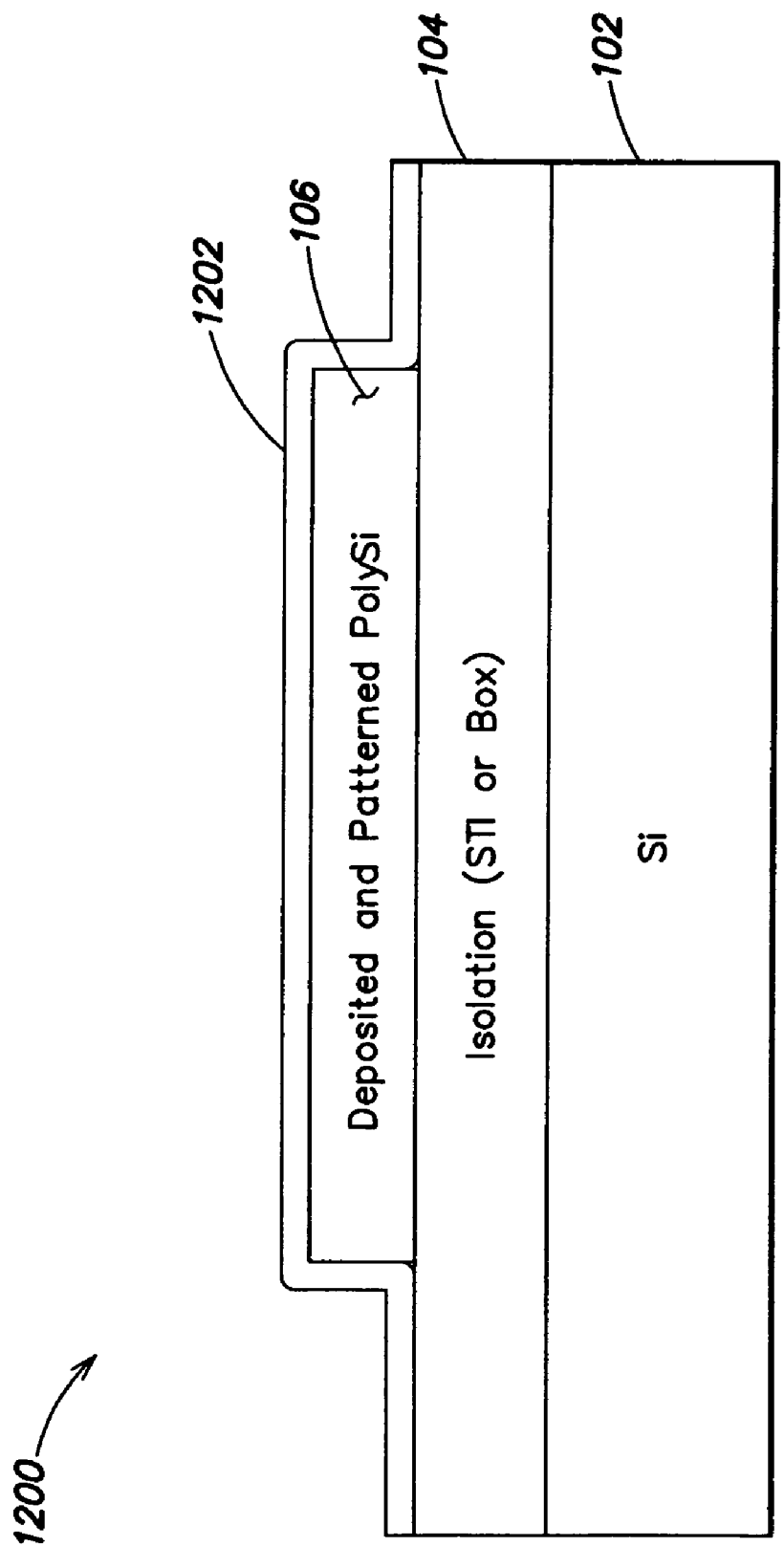
FIG. 12 illustrates a cross-sectional side view of a step of a second exemplary method of manufacturing the first exemplary eFuse in which a nitride layer is formed on patterned polysilicon layer of a substrate in accordance with an embodiment of the present invention.

Although a first exemplary method of manufacturing the first exemplary eFuse 600 is described above, the present invention provides additional methods of manufacturing such eFuses 600. The additional methods may improve upon the first exemplary method by enabling additional implant regions (e.g., a second implant region) to be aligned with a previously-formed first implant region in the polysilicon layer 106. In this manner, the second implant region may register itself to the first implant region. Aligning the implant regions of the polysilicon layer 106 in this manner may enable a plurality of eFuses 900 to be manufactured with a highly-reproducible reverse biased leakage current during sensing. For example, FIG. 12 illustrates a cross-sectional side view of a step of a second exemplary method of manufacturing the first exemplary eFuse 600 in which a nitride layer is formed on patterned polysilicon layer of a substrate in accordance with an embodiment of the present invention. With reference to FIG. 12, the second exemplary method of manufacturing the first exemplary eFuse 600 may process a patterned substrate 1200 similar to the patterned substrate 100 of FIG. 1. CVD or another suitable method may be employed to deposit (e.g., conformally) a layer 1202 of nitride (e.g., silicon nitride) or another suitable material on the substrate 1200. The nitride layer 1202 may be about 5 nm to about 100 nm thick (although a larger or smaller and/or different thickness range may be employed).

Figure 13:
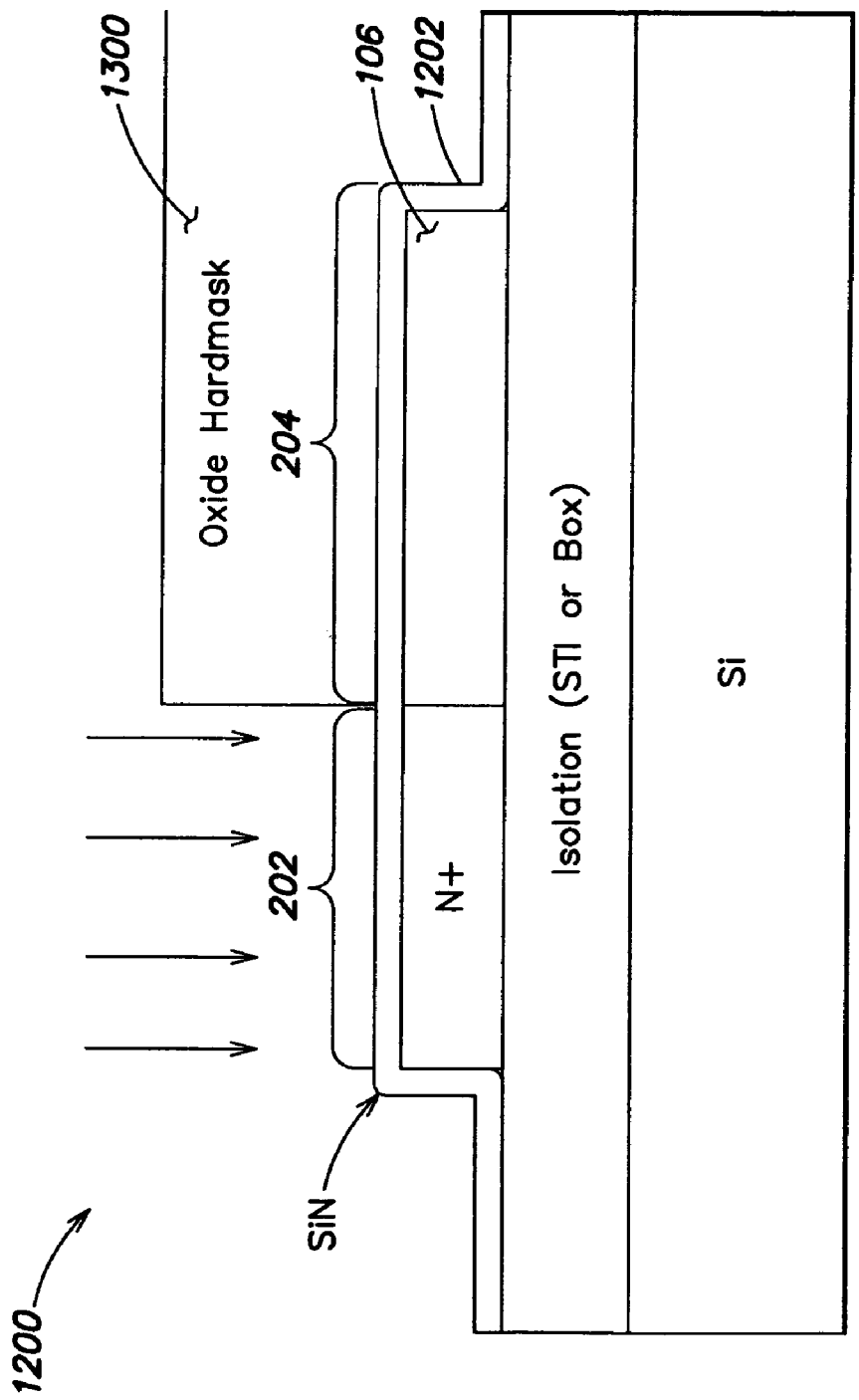
FIG. 13 illustrates a cross-sectional side view of a step of the second exemplary method of manufacturing the first exemplary eFuse in which impurity atoms are implanted into a portion of the polysilicon layer to form an N+ region in accordance with an embodiment of the present invention.

FIG. 13 illustrates a cross-sectional side view of a step of the second exemplary method of manufacturing the first exemplary eFuse 600 in which impurity atoms are implanted into a portion of the polysilicon layer 106 to form an N+ region in accordance with an embodiment of the present invention. With reference to FIG. 13, CVD or another suitable method may be employed to form an oxide layer on the substrate 1200. The oxide layer may be about 50 nm to about 500 nm thick (although a larger or smaller and/or different thickness range may be employed). Chemical mechanical planarization (CMP) or another suitable method may be employed to planarize the oxide layer. RIE or another suitable method may be employed to remove portions of the oxide layer, thereby forming a first mask (e.g., an oxide hard mask) 1300. The thickness of the oxide mask 1300 is based on the thickness of the deposited oxide layer. In this manner, a top surface of a first portion 202 of the polysilicon layer 106 may be exposed and a top surface of a second portion 204 of the polysilicon layer 106, which is below the mask 1300, may not be exposed.

An implant process or another suitable method may be employed to implant N+ impurity atoms or the like (e.g., dopant) through the nitride layer 1202 into the polysilicon layer 106. More specifically, the implant (e.g., logic N+ polysilicon and diffusion implant) may form a first highly-doped region such as an N+ doped region in the exposed portion (e.g., first portion 202) of the polysilicon layer 106. However, the mask 1300 may prevent the impurity atoms from reaching the second portion 204 of the polysilicon layer 106 during implanting, thereby protecting the second portion 204.

Figure 14:
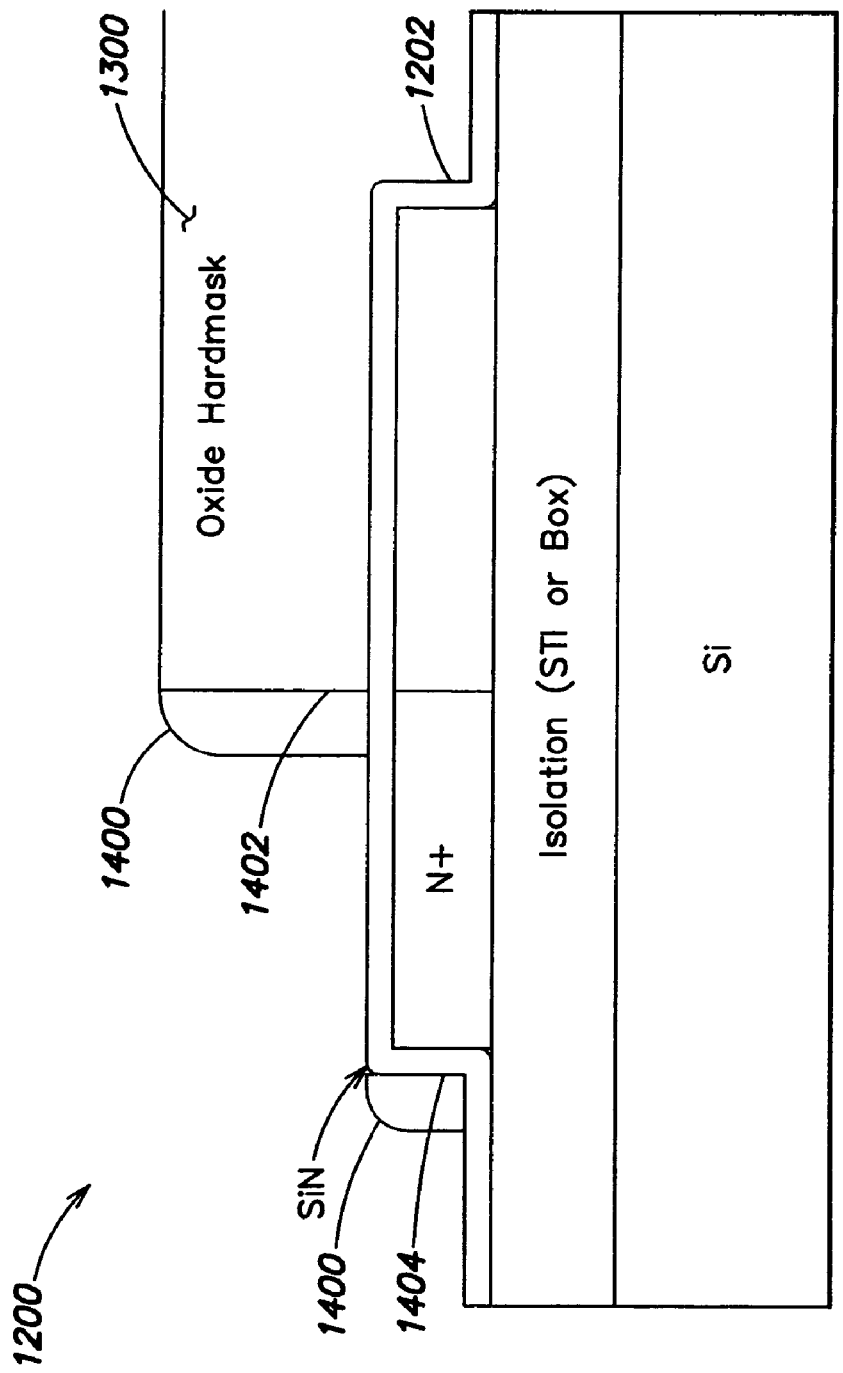
FIG. 14 illustrates a cross-sectional side view of a step of the second exemplary method of manufacturing the first exemplary eFuse in which one or more oxide spacers are formed on the substrate in accordance with an embodiment of the present invention.

FIG. 14 illustrates a cross-sectional side view of a step of the second exemplary method of manufacturing the first exemplary eFuse in which one or more oxide spacers are formed on the substrate in accordance with an embodiment of the present invention. With reference to FIG. 14, CVD or another suitable method may be employed to deposit (e.g., conformally) a layer of oxide (e.g., silicon oxide) on the substrate 1200. Thereafter, RIE or another suitable method may be employed to remove one or more portions of the oxide layer, thereby forming one or more oxide spacers 1400 (or spacers of another suitable material). For example, an oxide spacer 1400 may be formed on an exposed sidewall 1402 of the oxide mask 1300 and an exposed sidewall 1404 of the nitride layer 1202. The thickness of the one or more oxide spacers 1400 may be based on the thickness of the deposited oxide layer. The thickness of the oxide spacer 1400 may determine a distance between an edge of the N+ doped region and a second highly-doped region such as a P+ doped region subsequently formed by impurity atom implanting. More specifically, the width of the oxide spacer 1400 may determine the width of a lightly-doped region such as a P− doped implant region subsequently formed between the N+ doped region and the P+ doped region. Thus, the thickness of the deposited oxide layer, and therefore, the oxide spacer 1400 may serve as a design variable employed to determine characteristics of a diode subsequently formed during the second exemplary method of manufacturing the first exemplary eFuse 600. Consequently, the oxide spacer thickness employed while manufacturing eFuses 600 may be varied to fine tune diode characteristics of manufactured eFuses 600, respectively.

Figure 15:
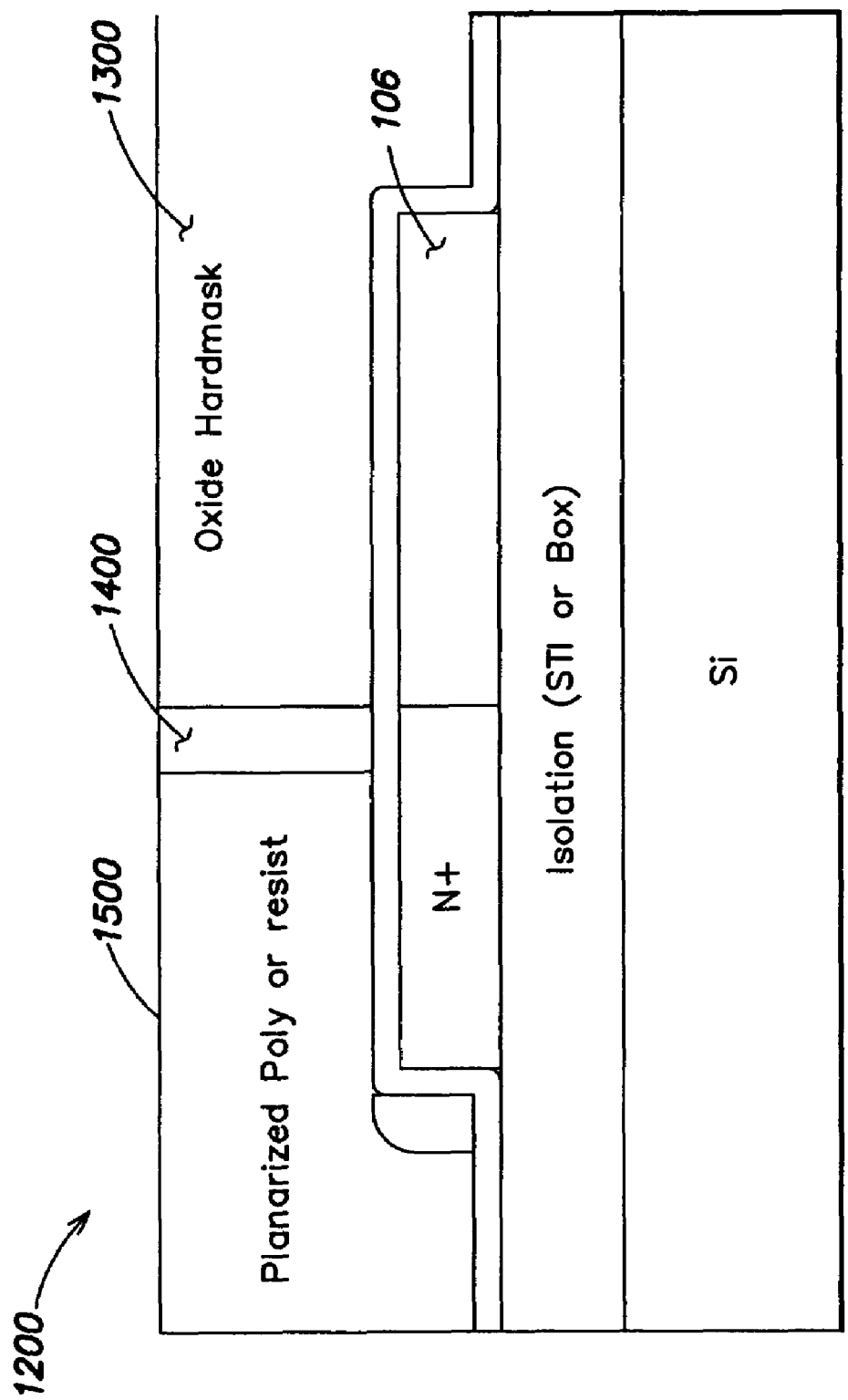
FIG. 15 illustrates a cross-sectional side view of a step of the second exemplary method of manufacturing the first exemplary eFuse in which polysilicon or resist layer is formed on the substrate in accordance with an embodiment of the present invention.

FIG. 15 illustrates a cross-sectional side view of a step of the second exemplary method of manufacturing the first exemplary eFuse in which polysilicon or resist layer is formed on the substrate in accordance with an embodiment of the present invention. With reference to FIG. 15, a layer 1500 of polysilicon, photoresist, or another suitable material (e.g., another polymer) may be formed on the substrate 1200. For example, CVD or another suitable method may be employed to deposit a layer of polysilicon on the substrate 1200. Alternatively, a spin-on technique or another suitable method may be employed to deposit a photoresist layer on the substrate 1200. Thereafter, CMP or another suitable method may be employed to planarize the layer 1500 of polysilicon or photoresist. The layer 1500 of polysilicon or photoresist may be planarized such that a top portion of an oxide spacer 1400 above the polysilicon layer 106 and the oxide mask 1300 may be consumed. Consequently, the top portion of such oxide spacer 1400 may be flat.

Figure 16:
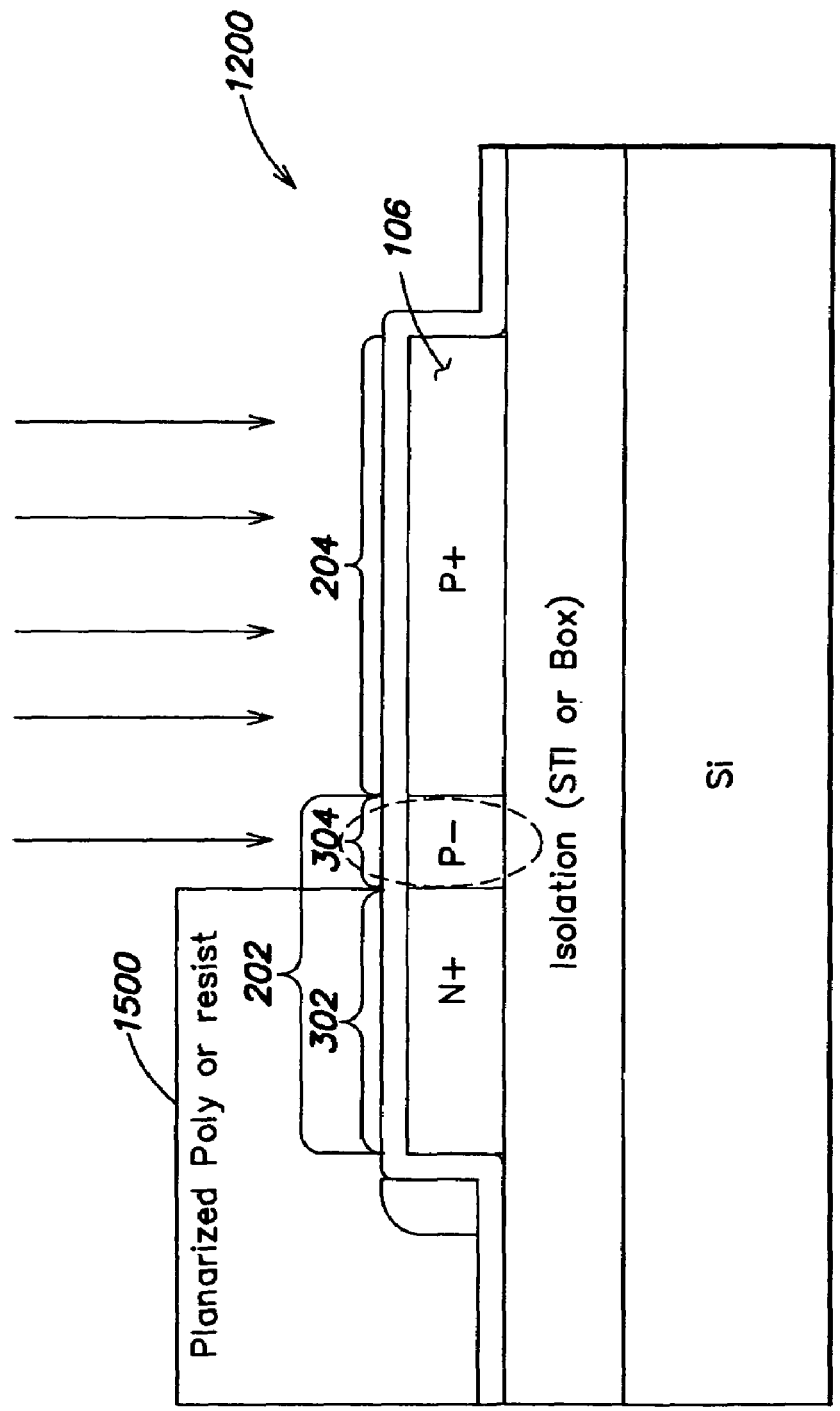
FIG. 16 illustrates a cross-sectional side view of a step of the second exemplary method of manufacturing the first exemplary eFuse in which oxide is etched from the substrate and impurity atoms are implanted into a portion of the polysilicon layer to form a P+ region and a P− region in accordance with an embodiment of the present invention.

FIG. 16 illustrates a cross-sectional side view of a step of the second exemplary method of manufacturing the first exemplary eFuse in which oxide is etched from the substrate and impurity atoms are implanted into a portion of the polysilicon layer to form a P+ region and a P− region in accordance with an embodiment of the present invention. With reference to FIG. 16, etching or another suitable method may be employed remove exposed oxide from the substrate 1200. For example, isotropic etching selective to polysilicon or photoresist and nitride may be employed to remove the exposed oxide spacer 1400 and oxide mask 1300 from the substrate 1200. In this manner, a first sub-portion 302 of the first portion 202 of the polysilicon layer 106 may be protected (e.g., covered) by the layer 1500 of polysilicon or photoresist. However, a second sub-portion 304 of the first portion 202 and the second portion 204 of the polysilicon layer 106 may be exposed.

An implant process or another suitable method may be employed to implant P+ impurity atoms or the like (e.g., dopant) into the polysilicon layer 106. An impurity atom dosage may be selected such that the implant (e.g., logic P+ polysilicon and diffusion implant) may form a lightly-doped region such as a P− doped region in the second sub-portion 304 of the first portion 202 of the polysilicon layer 106 and a highly-doped region such as a P+ doped region in the second region 204 of the polysilicon layer 106. More specifically, the P+ implant may compensate the doping of the N+ doped region, thereby forming a P− doped region. In this manner, the oxide spacer (1400 in FIG. 14) may define a region (e.g., an overlap region) of the polysilicon layer 106 that receives both the N+ implant and the P+ implant, thereby defining a width of the P− region formed in the polysilicon layer 106. Consequently, the oxide spacer 1400 may define a distance an edge of the P+ doped region may be offset from an edge of the N+ doped region. In some embodiments, the P+ implant described above may be performed concurrently with a P+ implant performed while forming regions of MOSFETs (e.g., PMOSs) being manufactured on the substrate 1200 (although the P+ implant described above may be performed sooner or later).

Figure 17:
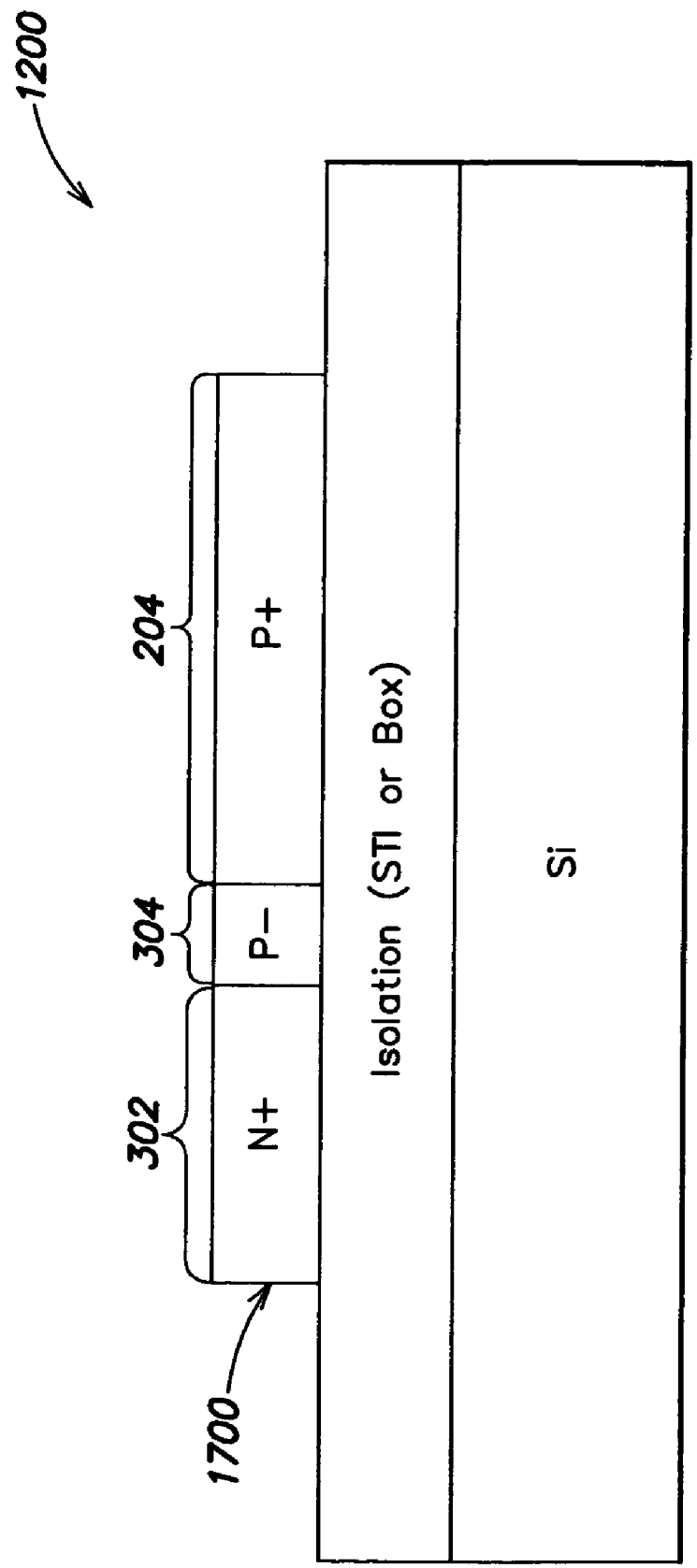
FIG. 17 illustrates a cross-sectional side view of a step of the second exemplary method of manufacturing the first exemplary eFuse in which the substrate undergoes annealing after the polysilicon or resist layer, one or more oxide spacers and the nitride layer are removed from the substrate.

FIG. 17 illustrates a cross-sectional side view of a step of the second exemplary method of manufacturing the first exemplary eFuse in which the substrate undergoes annealing after the polysilicon or resist layer, one or more oxide spacers and the nitride layer are removed from the substrate. With reference to FIG. 17, the layer 1500 of polysilicon or photoresist may be removed from the substrate 1200. For example, RIE or another suitable method may be employed to remove a layer of polysilicon from the substrate 1200. Alternatively, a photoresist stripper bath or another suitable method may be employed to strip a photoresist layer from the substrate 104. RIE or another suitable method may be employed to remove one or more oxide spacers 1400 from the substrate 1200. For example, the oxide spacer 1400 adjacent the sidewall 1404 of the nitride layer 1202 may be removed. In a similar manner, the nitride layer 1202 may be removed from the substrate 1200.

The substrate 1200 may undergo annealing in the manner described above with reference to FIG. 4. The high temperature of annealing may activate the implanted dopants N+ dopants and/or P+ dopants, thereby enabling such dopants to diffuse through respective regions in which the dopants were implanted 302, 204, 304. During annealing one or more implant regions, such as the P− region, may expand. In this manner, a diode 1700, having a pN-junction where the first sub-portion 302 couples to the second sub-portion 304, may be formed in the polysilicon layer 106.

Figure 18:
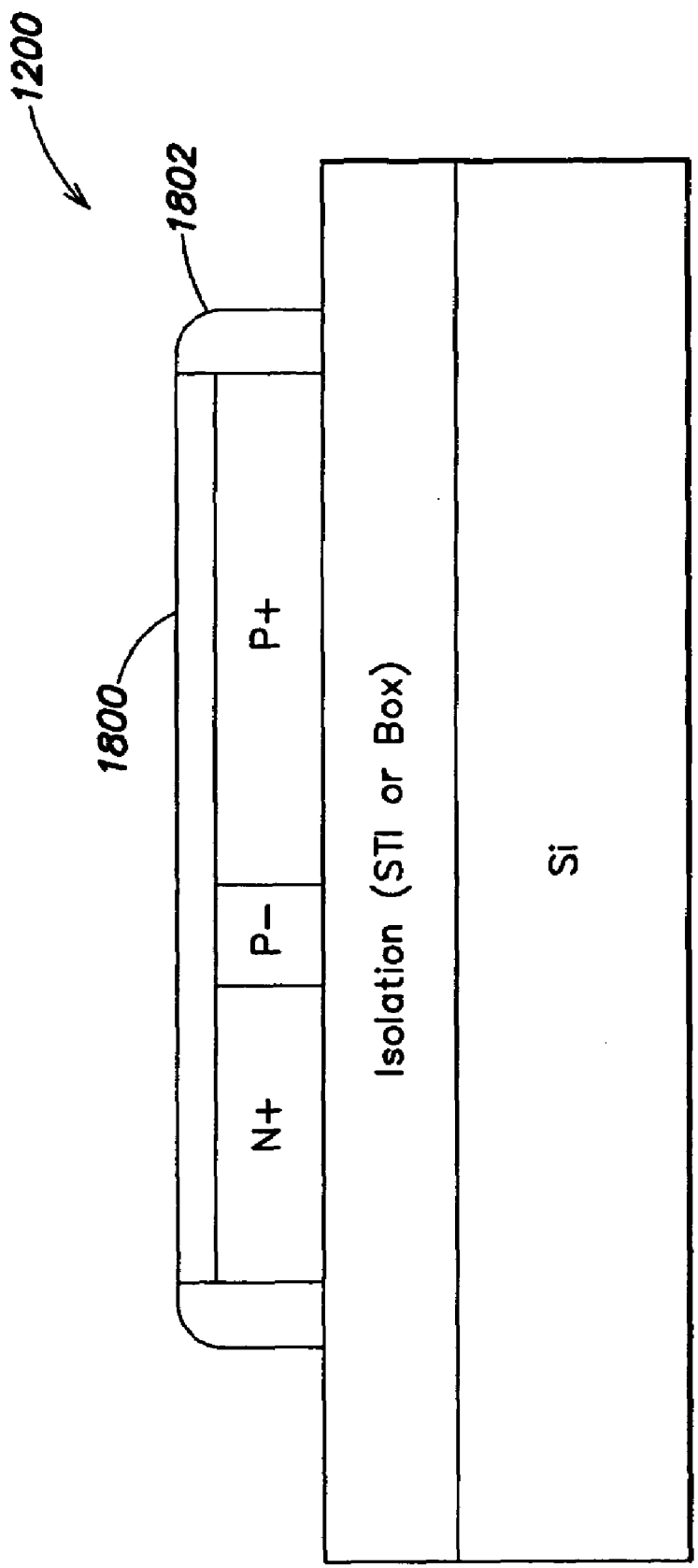
FIG. 18 illustrates a cross-sectional side view of a step of the second exemplary method of manufacturing the first exemplary eFuse in which spacers and a shunting silicide layer are formed on the substrate in accordance with an embodiment of the present invention.

FIG. 18 illustrates a cross-sectional side view of a step of the second exemplary method of manufacturing the first exemplary eFuse in which spacers and a shunting silicide layer are formed on the substrate in accordance with an embodiment of the present invention. With reference to FIG. 18, a silicide layer 1800 and spacers 1802 may be formed on the substrate in a manner similar to that described with reference to FIG. 5, and therefore, the step is not described in detail herein. Thereafter, interlevel dielectrics, vias and wiring may be formed on the substrate 1200 in a manner similar to that described above with reference to FIG. 6, and therefore, the step is not described in detail herein.

Through use of the second exemplary method of manufacturing the first exemplary eFuse 600, a spacer 1400 (e.g., an oxide spacer) may be employed to align the mask 1500 employed while forming the P+ region with the mask 1300 employed while forming the N+ region. In this manner, the spacer 1400 may enable an edge of mask 1500 to register itself with an edge of mask 1300, and vice versa. By aligning the masks 1500, 1300 in this manner, the P+ doped implant region may be positioned relative to the N+ doped implant region of the polysilicon layer 106 as desired.

The present invention may also provide a second exemplary method of manufacturing the second exemplary eFuse 900. The second exemplary method of manufacturing the second exemplary eFuse 900 may be similar to the second exemplary method of manufacturing the first exemplary eFuse 600. However, in contrast to the second exemplary method of manufacturing the first exemplary eFuse 600, the second exemplary method of manufacturing the second eFuse 900 may form the second exemplary eFuse 900 from a substrate, similar to the substrate 906 of FIG. 9, including a silicon layer (e.g., a bulk substrate), a layer 908 of insulating oxide (e.g., buried oxide (BOX)) formed on the silicon layer, and an SOI layer 904 (e.g., a layer of single crystal silicon or another suitable material) formed on the insulating oxide layer 908. The second exemplary method of manufacturing the second exemplary eFuse 900 may pattern the SOI layer 904 and form portions (e.g., the diodic element) of the eFuse 900 in such patterned SOI layer 904. Processing of the substrate 906 may be similar to the steps of the second exemplary method of manufacturing the first exemplary eFuse 600 illustrated in FIGS. 10-18, but may differ in the following ways. Following the patterning of the SOI layer 904, which serves as an area including active silicon (e.g., RX level), and prior to gate processing, N+ and P+ implants may be made into respective regions of the SOI layer 904, in a manner which is similar steps of the first exemplary method of manufacturing the second exemplary eFuse 900 illustrated in FIGS. 12-17. During such implanting, regions of one or more MOSFETS being manufactured on the substrate 906 may be protected by a block mask formed from a patterned photoresist layer.

Thereafter, normal gate processing for the MOSFETs may be performed. For example, such gate processing may include deposition and patterning of a gate conductor, extension, halo implants, spacer formation, and source-drain implantation. During gate processing, the implanted regions of the SOI layer 904 may be protected by a photoresist layer patterned by one or more block masks. Thereafter, all gate conductor material may be etched off of the implanted regions of the SOI layer 904, and CVD or another suitable method may be employed to form the layer 910 of silicide on the SOI layer 904. Alternatively, the silicide layer 910 may be formed during a different time. For example, if a shallower silicide layer is desired above the SOI layer 904, CVD or another suitable method followed by RIE or another suitable method may be employed to form a layer of insulating material on the SOI layer 904 during gate conductor silicidation. Thereafter, the shallower silicide layer may be formed on the SOI layer 904 in the manner described above.

The second exemplary method of manufacturing the second exemplary eFuse 900 may improve upon the first exemplary method of manufacturing the second exemplary eFuse 900 by enabling a second implant region to be aligned with a previously-formed first implant region in the SOI layer 904. In this manner, the second implant region may register itself to the first implant region. Aligning the implant regions of the SOI layer 904 in this manner may enable a plurality of eFuses 900 to be manufactured with a highly-reproducible reverse biased leakage current during sensing.

Further, the present invention may provide additional methods of manufacturing such eFuses 600, 900. Similar to the second exemplary method of manufacturing the first exemplary eFuse 600 and the second exemplary method of manufacturing the second exemplary eFuse 900, a third exemplary method of manufacturing the first exemplary eFuse 600 and a third exemplary method of manufacturing the second exemplary eFuse 900, respectively, may enable a second implant region to be aligned with a previously-formed first implant region in the polysilicon layer. Further, such methods may be employed to manufacture eFuses 600, 900 including different types of diodes (e.g., PIN diodes).

Figure 19:
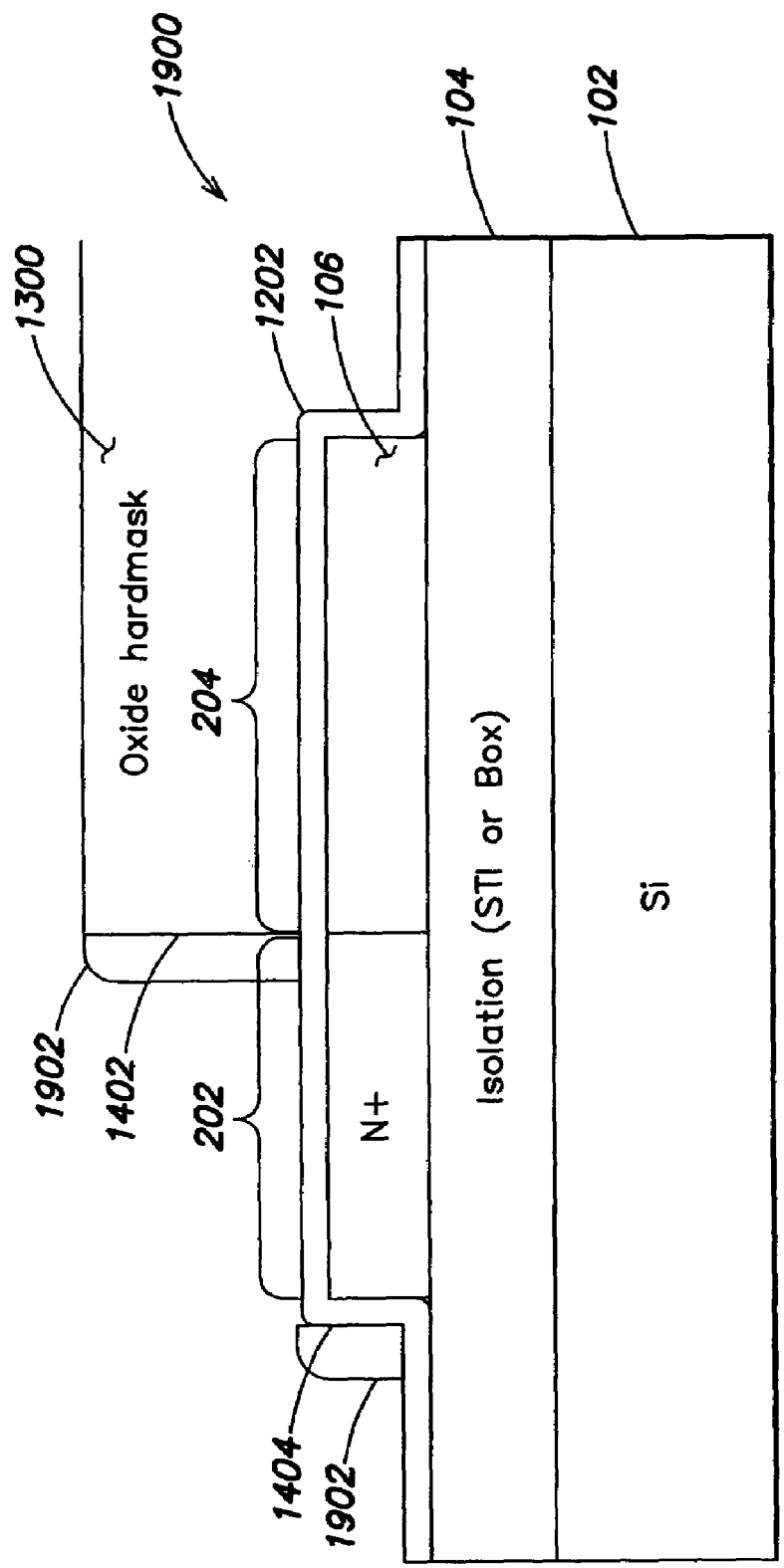
FIG. 19 illustrates a cross-sectional side view of a step of a third exemplary method of manufacturing the first exemplary eFuse in which one or more nitride spacers are formed on the substrate in accordance with an embodiment of the present invention.

The third exemplary method of manufacturing the first eFuse 600 may be similar to the second exemplary method of manufacturing the first eFuse 600. For example, a substrate 1900 may be processed as illustrated in FIGS. 12-13. Thereafter, FIG. 19 illustrates a cross-sectional side view of a step of the third exemplary method of manufacturing the first exemplary eFuse 600 in which one or more nitride spacers are formed on the substrate 1900 in accordance with an embodiment of the present invention. With reference to FIG. 19, CVD or another suitable method may be employed to deposit (e.g., conformally) a layer of nitride (e.g., silicon nitride) on the substrate 1900. Thereafter, RIE or another suitable method may be employed to remove one or more portions of the nitride layer, thereby forming one or more nitride spacers 1902. For example, a nitride spacer 1902 may be formed on an exposed sidewall 1402 and an exposed sidewall 1402 of the nitride layer 1202. The thickness of the one or more nitride spacers 1902 may be based on the thickness of the deposited nitride layer. The thickness of the nitride spacer 1902 may determine a distance between an edge of the first highly-doped region (e.g., N+ doped region) and a second highly-doped region (e.g., a P+ doped region) subsequently formed by impurity atom implanting. More specifically, the width of the nitride spacer 1902 may determine the width of a lightly-doped region (e.g., a P– doped implant region) subsequently formed between the N+ doped region and the P+ doped region. The thickness of the deposited nitride layer, and therefore, the nitride spacer 1902 may serve as a design variable employed to determine characteristics of a diode subsequently formed during the third exemplary method of manufacturing the first exemplary eFuse 600. Therefore, the nitride spacer thickness employed while manufacturing eFuses 600 may be varied to fine tune diode characteristics of manufactured eFuses 600, respectively.

Figure 20:
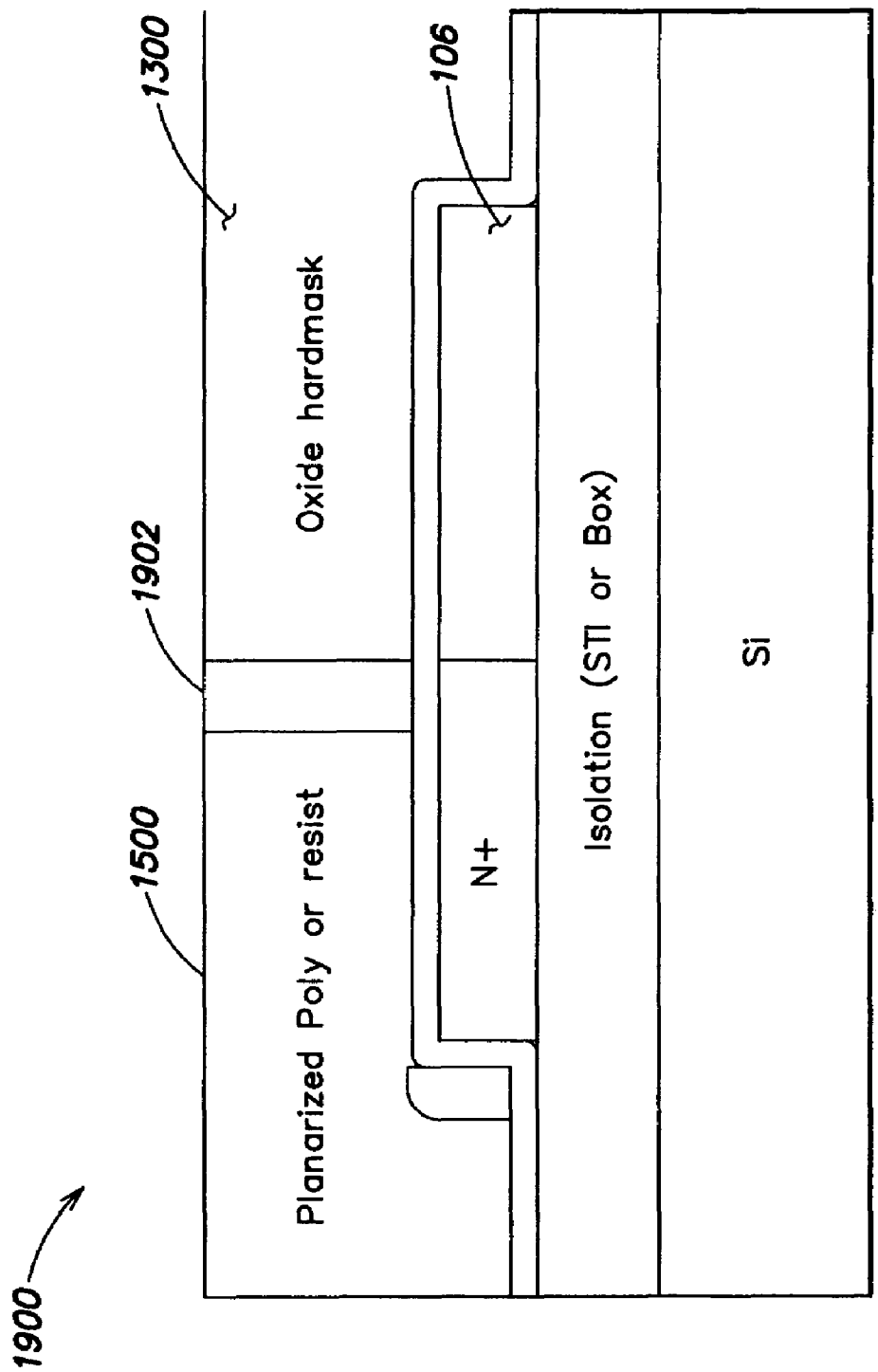
FIG. 20 illustrates a cross-sectional side view of a step of the third exemplary method of manufacturing the first exemplary eFuse in which a polysilicon or resist layer is formed on the substrate in accordance with an embodiment of the present invention.

FIG. 20 illustrates a cross-sectional side view of a step of the third exemplary method of manufacturing the first exemplary eFuse in which a polysilicon or resist layer is formed on the substrate in accordance with an embodiment of the present invention. With reference to FIG. 20, a layer 1500 of polysilicon, photoresist, or another suitable material (e.g., another polymer) may be formed on the substrate 1900. For example, CVD or another suitable method may be employed to deposit a layer of polysilicon on the substrate 1900. Alternatively, a spin-on technique or another suitable method may be employed to deposit a photoresist layer on the substrate 1900. Thereafter, CMP or another suitable method may be employed to planarize the layer 1500 of polysilicon or photoresist. The layer 1500 of polysilicon or photoresist may be planarized such that a top portion of a nitride spacer 1902 above the polysilicon layer 106 and the oxide mask 1300 may be consumed. Consequently, the top portion of such nitride spacer 1902 may be flat.

Figure 21:
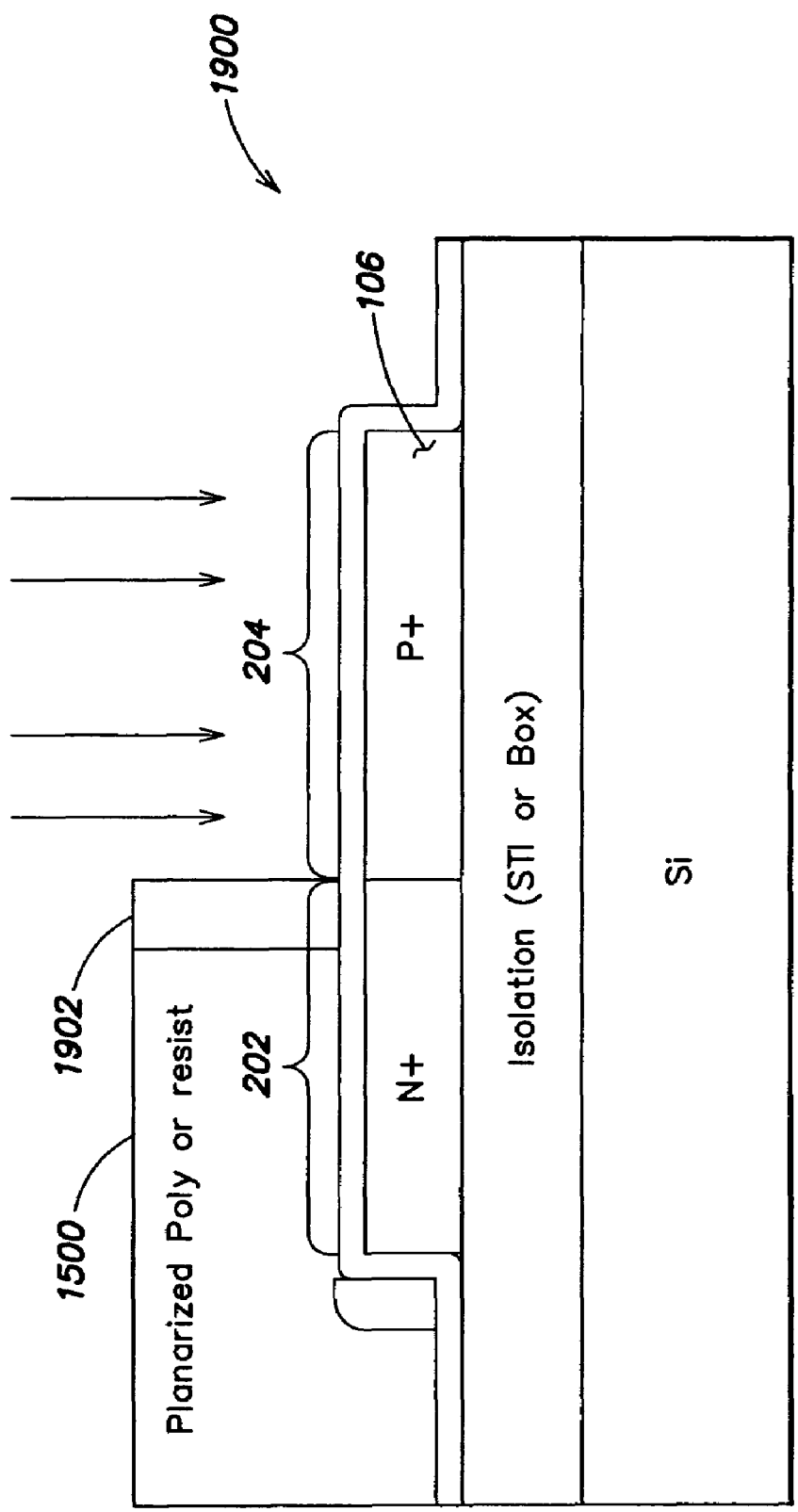
FIG. 21 illustrates a cross-sectional side view of a step of the third exemplary method of manufacturing the first exemplary eFuse in which oxide is etched from the substrate and impurity atoms are implanted into a portion of the polysilicon layer to form a P+ region in accordance with an embodiment of the present invention.

FIG. 21 illustrates a cross-sectional side view of a step of the third exemplary method of manufacturing the first exemplary eFuse 600 in which oxide is etched from the substrate 1900 and impurity atoms are implanted into a portion of the polysilicon layer 106 to form a first slightly-doped region such as a P+ region in accordance with an embodiment of the present invention. With reference to FIG. 21, etching or another suitable method may be employed remove exposed oxide from the substrate 1900. For example, isotropic etching selective to polysilicon or photoresist and nitride may be employed to remove the exposed oxide mask 1300 from the substrate 1900. In this manner, the first portion 202 of the polysilicon layer 106 may be protected (e.g., covered) by the layer 1500 of polysilicon or photoresist. However, the second portion 204 of the polysilicon layer 106 may be exposed.

An implant process or another suitable method may be employed to implant P+ impurity atoms or the like (e.g., dopant) into the polysilicon layer 106. An impurity atom dosage may be selected such that the implant (e.g., logic P+ polysilicon and diffusion implant) may form a P+ doped region in the second region 204 of the polysilicon layer 106. Consequently, the nitride spacer 1902 may define a distance an edge of the P+ doped region may be offset from an edge of the N+ doped region. In some embodiments, the P+ implant described above may be performed concurrently with a P+ implant performed while forming regions of MOSFETs (e.g., PMOSs) being manufactured on the substrate (although the P+ implant described above may be performed sooner or later).

Figure 22:
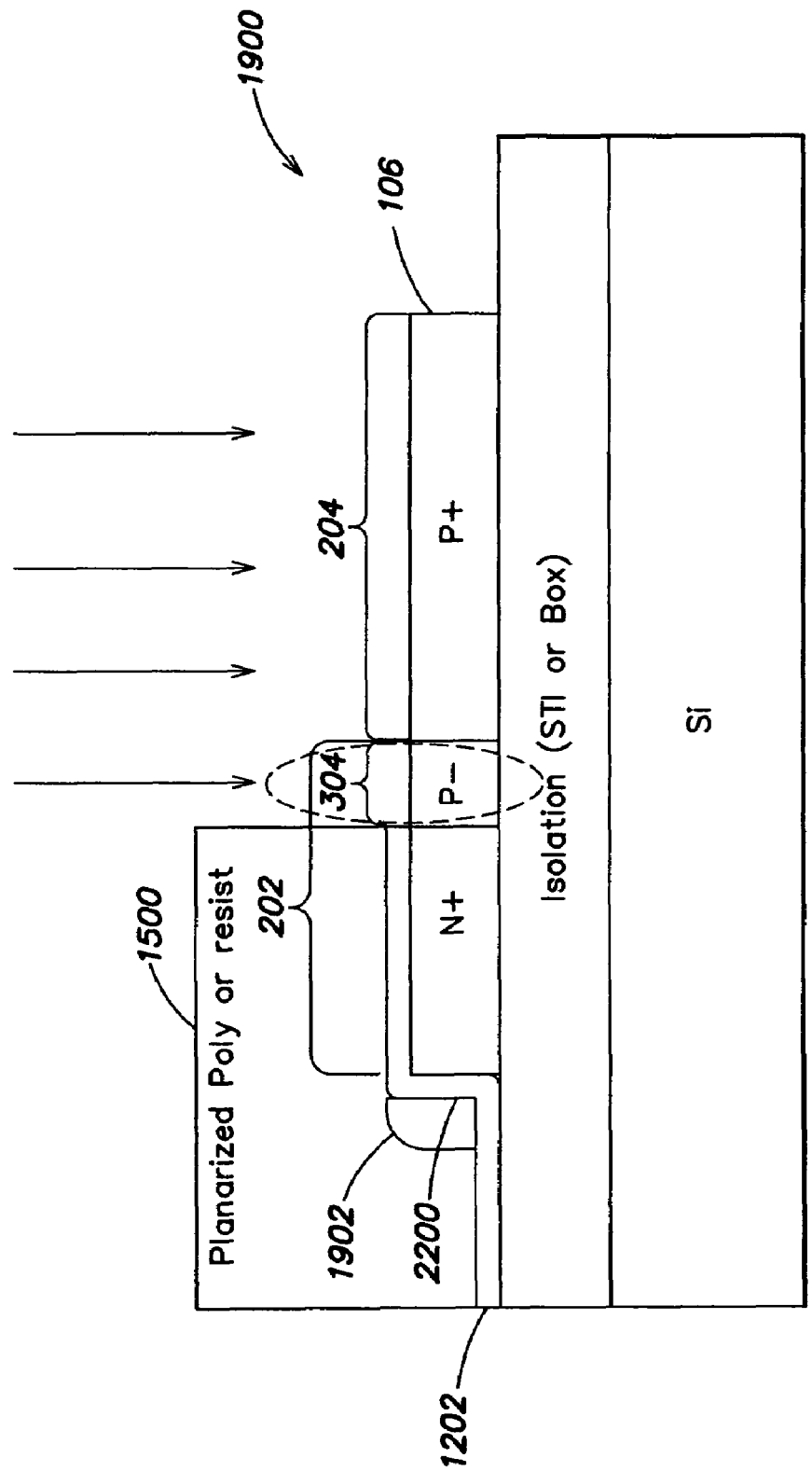
FIG. 22 illustrates a cross-sectional side view of a step of the third exemplary method of manufacturing the first exemplary eFuse in which nitride is etched from the substrate and impurity atoms are implanted into a portion of the polysilicon layer to form a P− region in accordance with an embodiment of the present invention.

FIG. 22 illustrates a cross-sectional side view of a step of the third exemplary method of manufacturing the first exemplary eFuse 600 in which nitride is etched from the substrate 1900 and impurity atoms are implanted into a portion of the polysilicon layer 106 to form a P– region in accordance with an embodiment of the present invention. With reference to FIG. 22, RIE or another suitable method may be employed to remove an exposed nitride spacer 1902 from the substrate 1900. An implant process or another suitable method may be employed to implant impurity atoms (e.g., dopant), such as P+ impurity atoms into exposed portions of the polysilicon layer 106. An impurity atom dosage may be selected (e.g., customized) for this third implant such that the implant (e.g., logic P+ polysilicon and diffusion implant) may form a P– doped region in the second sub-portion 304 of the first region 202 of the polysilicon layer 106. Consequently, the nitride spacer 1902 may define a distance an edge of the P+ doped region may be offset from an edge of the N+ doped region, and the width of the P– region. In this manner, based on the impurity atom dosage, an N+P–, PIN or another suitable diode 2200 may be formed in the polysilicon layer 106.

Thereafter, the layer 1500 of polysilicon or photoresist, exposed nitride spacers 1902 and the nitride layer 1202 may be removed from the substrate 1900. The substrate 1900 may undergo annealing (e.g., to activate implanted dopants) in a manner similar to that illustrated with reference to FIG. 17. Consequently, such steps are not described in detail herein. Thereafter, spacers and a silicide layer may be formed on the substrate 1900 in accordance with an embodiment of the present invention in a manner similar to that illustrated with reference to FIG. 18. Consequently, such step is not described in detail herein. Thereafter, interlevel dielectrics, vias and wiring may be formed on the substrate 1900 in a manner similar to that described above with reference to FIG. 6, and therefore, such step is not described in detail herein.

Through use of the third exemplary method of manufacturing the first exemplary eFuse 600, a spacer 1902 (e.g., a nitride spacer) may be employed to align the mask 1500 employed while forming the P+ region (and P– region) with the mask 1300 employed while forming the N+ region. In this manner, the spacer 1902 may enable an edge of mask 1500 to register itself with an edge of mask 1300, and vice versa. By aligning the masks 1500, 1300 in this manner, the P+ doped implant region may be positioned relative to the N+ doped implant region of the polysilicon layer 106 as desired.

The present invention may also provide a third exemplary method of manufacturing the second exemplary eFuse 900. The third exemplary method of manufacturing the second exemplary eFuse 900 may be similar to the third exemplary method of manufacturing the first exemplary eFuse 600. However, in contrast to the third exemplary method of manufacturing the first exemplary eFuse 600, the third exemplary method of manufacturing the second exemplary eFuse 900 may form the second exemplary eFuse 900 from a substrate, similar to the substrate 906 of FIG. 9, including a silicon layer (e.g., a bulk substrate), a layer 908 of insulating oxide (e.g., buried oxide (BOX)) formed on the silicon layer, and an SOI layer 904 (e.g., a layer of single crystal silicon or another suitable material) formed on the insulating oxide layer 908. The third exemplary method of manufacturing the second exemplary eFuse 900 may pattern the SOI layer 904 and form portions (e.g., the diodic element) of the eFuse 900 in such patterned SOI layer 904. Processing of the substrate 906 may be similar to the steps of the third exemplary method of manufacturing the first exemplary eFuse 600, but may differ in the following ways. Following the patterning of the SOI layer 904, which serves as an area including active silicon (e.g., RX level), and prior to gate processing, N+ and P+ implants are made into respective regions of the SOI layer 904, in a manner which is similar to corresponding implant steps of the third exemplary method of manufacturing the first exemplary eFuse 600. During such implanting, regions of one or more MOSFETS being manufactured on the substrate 906 may be protected by a block mask formed from a patterned photoresist layer.

Thereafter, normal gate processing for the MOSFETs may be performed. For example, such gate processing may include deposition and patterning of a gate conductor, extension, halo implants, spacer formation, and source-drain implantation. During gate processing, the implanted regions of the SOI layer 904 may be protected by a photoresist layer patterned by one or more block masks. Thereafter, all gate conductor material may be etched off of the implanted regions of the SOI layer 904, and CVD or another suitable method may be employed to form the layer 910 of silicide on the SOI layer 904. Alternatively, the silicide layer 910 may be formed during a different time. For example, if a shallower silicide layer is desired above the SOI layer 904, CVD or another suitable method followed by RIE or another suitable method may be employed to form a layer of insulating material on the SOI layer 904 during gate conductor silicidation. Thereafter, the shallower silicide layer may be formed on the SOI layer 904 in the manner described above.

The third exemplary method of manufacturing the first exemplary eFuse 600 and the third exemplary method of manufacturing the second exemplary eFuse 900 may improve upon the other exemplary methods of manufacturing an eFuse 600, 900 by enabling a second implant region to be aligned with a previously-formed first implant region in the polysilicon or SOI layer.

The present invention may also provide methods to form the exemplary eFuses 600, 900, which employ a larger amount of implant processes (e.g., three implant processes) compared to some methods described above. For example, such methods may be similar to the third exemplary method described with reference to FIGS. 19-22. However, in contrast, the nitride spacer 1902 may be formed before a first implant process to form a highly-doped region (e.g., a N+ region). Therefore, the resulting first highly-doped region may be smaller than that formed by the third exemplary method because the nitride spacer 1902 may prevent the first implant from reaching portions of the semiconducting layer thereunder 106. Thereafter, the oxide hardmask 1300 may be removed and the planarized poly or resist mask 1500 may be formed. A second implant process may be employed to form the second highly-doped region 204 (e.g., a P+ region). Thereafter, the planarized poly or resist mask 1500 and the nitride spacer 1902 may be removed. Further, a third implant process may be employed to implant P– impurity atoms or the like over the entire semiconducting layer 106. In this manner, the third implant process may form the slightly-doped region 304 (e.g., a P– region) without affecting the first and second highly-doped regions 202, 204. Alternatively, by not performing the third implant process, the present method may be employed to form a PiN diode.

The foregoing description discloses only exemplary embodiments of the invention. Modifications of the above disclosed apparatus and methods which fall within the scope of the invention will be readily apparent to those of ordinary skill in the art. For instance, the present invention may provide an eFuse 600, 900 including a diodic element which may be exposed due to silicide electromigration during programming. Subsequent sensing of the programmed eFuse in a reverse bias configuration is independent of a silicide electromigration gap length because the resulting high-diodic element resistance is much greater than a tolerance associated with a variable migration range. Further, as stated, eFuses 600, 900 in accordance with an embodiment of the present invention may include a diodic element (e.g., a blocking diode). Therefore, subsequent healing of the eFuse 600, 900 may be reduced and/or eliminated as current is driven through the eFuse 600, 900. Such current may be independent of voltage applied across the eFuse 600, 900. Healing or reprogramming may occur in a conventional silicide (e.g., $NiSi_2$, $CoSi_2$, $TiSi_2$ or other silicide compositions) eFuse including a polysilicon layer which is a resistor (e.g., when the eFuse is continuously read). However, the present methods and apparatus may provide a silicide eFuse in which such healing is reduced and/or eliminated. Additionally, eFuses 600, 900 in accordance with an embodiment of the present invention may be employed in a read only memory (ROM) user programmable array, thereby providing a low power solution for such an array. Although an eFuse 600, 900 described above may include a diodic element including an N+ doped, a P– doped and a P+ doped region, in other embodiments, the diodic element may include different doped regions, such as a P+ doped, an N– doped and an N+ doped region.

Accordingly, while the present invention has been disclosed in connection with exemplary embodiments thereof, it should be understood that other embodiments may fall within the spirit and scope of the invention, as defined by the following claims.

The invention claimed is:

1. A method of manufacturing an eFuse, comprising:
   providing a substrate including a layer of insulating oxide and a semiconducting layer above the layer of insulating oxide;
   forming a diode in the semiconducting layer, wherein forming the diode in the semiconducting layer includes:
      forming a first heavily-doped region having a first polarity in the semiconducting layer;
      forming a second heavily-doped region having a second, opposite polarity in the semiconducting layer; and
      forming a lightly-doped region between the first and second heavily-doped regions in the semiconducting layer; and
   forming a layer of silicide above the diode, said layer of silicide being patterned to form a fusible conductor lying in contact with said first heavily-doped region, said lightly-doped region, and said second heavily-doped region, said fusible conductor extending from said first heavily-doped region, across said lightly-doped region, and to said second heavily-doped region.

2. The method of claim 1 wherein forming the second heavily-doped region includes positioning an edge of the second heavily-doped region based on a position of an edge of the first heavily-doped region.

3. The method of claim 1 wherein:
   a first portion of the diode forms a cathode;
   a second portion of the diode forms an anode; and
   when a more negative voltage is applied to the cathode than the anode, the diode is adapted to form a gap in the silicide layer, thereby exposing a portion of the diode where the first heavily-doped region couples to the lightly-doped region and thereby programming the eFuse.

4. The method of claim 3 wherein the diode is further adapted to provide a predetermined resistance when reverse biased.

5. The method of claim 4 wherein the diode is further adapted to limit a current through the eFuse to a predetermined value when reverse biased.

6. The method of claim 1 wherein:
   forming the first heavily-doped region includes forming an N+ region;
   forming the second heavily-doped region includes forming a P+ region; and
   forming the lightly-doped region includes forming a P– region.

7. The method of claim 1 wherein:
   forming the first heavily-doped region includes forming a P+ region;
   forming the second heavily-doped region includes forming an N+ region; and
   forming the lightly-doped region includes forming an N– region.

8. The method of claim 1 wherein:
   forming the first heavily-doped region includes employing a first implant process to form the first heavily-doped region;
   forming the second heavily-doped region includes employing a second implant process to form the second heavily-doped region; and
   forming the lightly-doped region includes employing a third implant process to form the lightly-doped region.

9. The method of claim 1 wherein:
   forming the first heavily-doped region includes employing a first implant process to form the first heavily-doped region; and
   forming the second heavily-doped region and forming the lightly-doped region includes employing a second implant process to form the second heavily-doped region and the lightly-doped region.

\* \* \* \* \*

UNITED STATES PATENT AND TRADEMARK OFFICE
CERTIFICATE OF CORRECTION

PATENT NO. : 7,659,168 B2  Page 1 of 1
APPLICATION NO. : 11/266740
DATED : February 9, 2010
INVENTOR(S) : Hsu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 737 days.

Signed and Sealed this

Thirtieth Day of November, 2010

David J. Kappos
*Director of the United States Patent and Trademark Office*